United States Patent
Yamazaki et al.

(10) Patent No.: US 7,518,146 B2
(45) Date of Patent: Apr. 14, 2009

(54) EL DISPLAY DEVICE INCLUDING COLOR FILTER AND LIGHT SHIELDING FILM

(75) Inventors: Shunpei Yamazaki, Tokyo (JP); Mayumi Mizukami, Kanagawa (JP); Toshimitsu Konuma, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 513 days.

(21) Appl. No.: 11/070,121

(22) Filed: Mar. 1, 2005

(65) Prior Publication Data
US 2005/0162092 A1     Jul. 28, 2005

Related U.S. Application Data

(63) Continuation of application No. 10/206,018, filed on Jul. 26, 2002, now Pat. No. 6,894,312, which is a continuation of application No. 09/661,022, filed on Sep. 13, 2000, now Pat. No. 6,445,005.

(30) Foreign Application Priority Data

| Sep. 17, 1999 | (JP) | 11-264672 |
| Sep. 17, 1999 | (JP) | 11-264680 |
| Nov. 26, 1999 | (JP) | 11-336247 |
| Nov. 26, 1999 | (JP) | 11-336248 |

(51) Int. Cl.
   *H01L 29/04*   (2006.01)

(52) U.S. Cl. .................. 257/72; 257/59; 257/E21.141; 257/E21.413; 257/E51.022

(58) Field of Classification Search .......... 257/59, 257/72, E21.141, E21.413, E51.022
See application file for complete search history.

(56) References Cited

U.S. PATENT DOCUMENTS 4,357,557 A   11/1982   Inohara et al. ............. 313/509

(Continued)

FOREIGN PATENT DOCUMENTS

EP          0 776 147 A1       5/1997

(Continued)

OTHER PUBLICATIONS

European Search Report for application No. EP 00 11 9584.1, mailed Mar. 2, 2006.

(Continued)

*Primary Examiner*—Andy Huynh
(74) *Attorney, Agent, or Firm*—Cook Alex Ltd.

(57) ABSTRACT

Plurality of pixels (102) are arranged on the substrate. Each of the pixels (102) is provided with an EL element which utilizes as a cathode a pixel electrode (105) connected to a current control TFT (104). On a counter substrate (110), a light shielding film (112) is disposed at the position corresponding to periphery of each pixel (102), while a color filter (113) is disposed at the position corresponding to each of the pixels (102). This light shielding film makes the contour of the pixels clear, resulting in an image display with high definition. In addition, it is possible to fabricate the EL display device of the present invention with most of an existing manufacturing line for liquid crystal display devices. Thus, an amount of equipment investment can be significantly reduced, thereby resulting in a reduction in the total manufacturing cost.

46 Claims, 13 Drawing Sheets

101:substrate 102:pixel 103:switching TFT 104:current control TFT 105:pixel electrode (cathode)
106:alkaline compound 107:EL layer 108:anode 109:passivasion film 110:counter substrate
111:gap between pixel electrodes 112:light shielding film 113a-113c:color filters 114:closed space

U.S. PATENT DOCUMENTS

| | | | |
|---|---|---|---|
| 5,072,263 A | 12/1991 | Watanabe et al. | 357/72 |
| 5,107,175 A | 4/1992 | Hirano et al. | |
| 5,124,204 A | 6/1992 | Yamashita et al. | |
| 5,189,405 A | 2/1993 | Yamashita et al. | |
| 5,190,794 A | 3/1993 | Yoshino et al. | 427/162 |
| 5,206,749 A | 4/1993 | Zavracky et al. | 359/59 |
| 5,317,236 A | 5/1994 | Zavracky et al. | 315/169.3 |
| 5,518,940 A | 5/1996 | Hodate et al. | 437/41 |
| 5,610,738 A | 3/1997 | Sasano et al. | 349/43 |
| 5,643,826 A | 7/1997 | Ohtani et al. | 437/88 |
| 5,654,811 A | 8/1997 | Spitzer et al. | 349/106 |
| 5,686,360 A | 11/1997 | Harvey, III et al. | |
| 5,693,956 A | 12/1997 | Shi et al. | |
| 5,708,484 A | 1/1998 | Someya et al. | 349/38 |
| 5,757,126 A | 5/1998 | Harvey, III et al. | |
| 5,771,562 A | 6/1998 | Harvey, III et al. | |
| 5,798,744 A | 8/1998 | Tanaka et al. | 345/92 |
| 5,811,177 A | 9/1998 | Shi et al. | |
| 5,859,627 A | 1/1999 | Hoshiya et al. | 345/100 |
| 5,882,761 A | 3/1999 | Kawami et al. | 428/69 |
| 5,909,081 A | 6/1999 | Eida et al. | 313/504 |
| 5,923,962 A | 7/1999 | Ohtani et al. | 438/150 |
| 5,943,107 A | 8/1999 | Kadota et al. | 349/44 |
| 5,952,778 A | 9/1999 | Haskal et al. | |
| 5,962,962 A | 10/1999 | Fujita et al. | |
| 6,049,167 A | 4/2000 | Onitsuka et al. | |
| 6,072,450 A | 6/2000 | Yamada et al. | 345/76 |
| 6,111,355 A | 8/2000 | Inoue et al. | |
| 6,114,183 A | 9/2000 | Hamada et al. | 438/29 |
| 6,114,715 A | 9/2000 | Hamada | 257/72 |
| 6,128,060 A | 10/2000 | Shimada et al. | 349/138 |
| 6,146,225 A | 11/2000 | Sheats et al. | |
| 6,150,187 A | 11/2000 | Zyung et al. | |
| 6,177,965 B1 * | 1/2001 | Takahara et al. | 349/5 |
| 6,181,062 B1 | 1/2001 | Hiraishi et al. | |
| 6,198,217 B1 | 3/2001 | Suzuki et al. | |
| 6,198,220 B1 | 3/2001 | Jones et al. | |
| 6,268,071 B1 | 7/2001 | Yasukawa et al. | 428/690 |
| 6,274,887 B1 | 8/2001 | Yamazaki et al. | 257/72 |
| 6,284,342 B1 | 9/2001 | Ebisawa et al. | |
| 6,362,030 B1 | 3/2002 | Nagayama et al. | 257/72 |
| 6,384,528 B1 | 5/2002 | Friend et al. | 313/504 |
| 6,392,340 B2 | 5/2002 | Yoneda et al. | 313/506 |
| 6,413,645 B1 | 7/2002 | Graff et al. | |
| 6,417,898 B1 * | 7/2002 | Izumi | 349/73 |
| 6,466,281 B1 * | 10/2002 | Huang et al. | 349/44 |
| 6,577,375 B1 * | 6/2003 | Umehara et al. | 349/158 |
| 6,580,214 B2 | 6/2003 | Yoneda et al. | 313/506 |
| 6,642,989 B2 | 11/2003 | Umehara et al. | 349/158 |
| 2001/0026127 A1 | 10/2001 | Yoneda et al. | 313/506 |
| 2002/0036463 A1 | 3/2002 | Yoneda et al. | 313/506 |
| 2002/0125817 A1 | 9/2002 | Yamazaki et al. | |
| 2003/0155573 A1 | 8/2003 | Yamazaki et al. | 257/72 |

FOREIGN PATENT DOCUMENTS

| | | |
|---|---|---|
| EP | 0 845 770 A1 | 6/1998 |
| EP | 0 845 812 | 6/1998 |
| EP | 0 999 595 | 5/2000 |
| JP | 61-096695 | 5/1986 |
| JP | 62-90260 | 4/1987 |
| JP | 07-130652 | 5/1995 |
| JP | 07-220871 | 8/1995 |
| JP | 08-075908 | 3/1996 |
| JP | 08-096959 | 4/1996 |
| JP | 8-234018 | 9/1996 |
| JP | 08-330602 | 12/1996 |
| JP | 09-063770 | 3/1997 |
| JP | 09-134781 | 5/1997 |
| JP | 09-148066 | 6/1997 |
| JP | 10-162952 | 6/1998 |
| JP | 10-189252 | 7/1998 |
| JP | 10-270363 | 10/1998 |
| JP | 10-289784 | 10/1998 |
| JP | 11-076967 | 3/1999 |
| JP | 11-251059 | 9/1999 |
| JP | 2000-077191 | 3/2000 |
| JP | 2000-173766 | 6/2000 |
| WO | WO-9634514 | 10/1996 |
| WO | WO 99/42983 | 8/1999 |

OTHER PUBLICATIONS

U.S. Appl. No. 09/735,096 (pending) to Nishi et al., including specification, claims, abstract, drawings and PTO filing receipt.

PTO Office Action re U.S. Appl. No. 10/337,886 (pending), mailed Dec. 4, 2003.

European Search Report for application No. EP 00 11 9584, mailed Mar. 12, 2004.

* cited by examiner

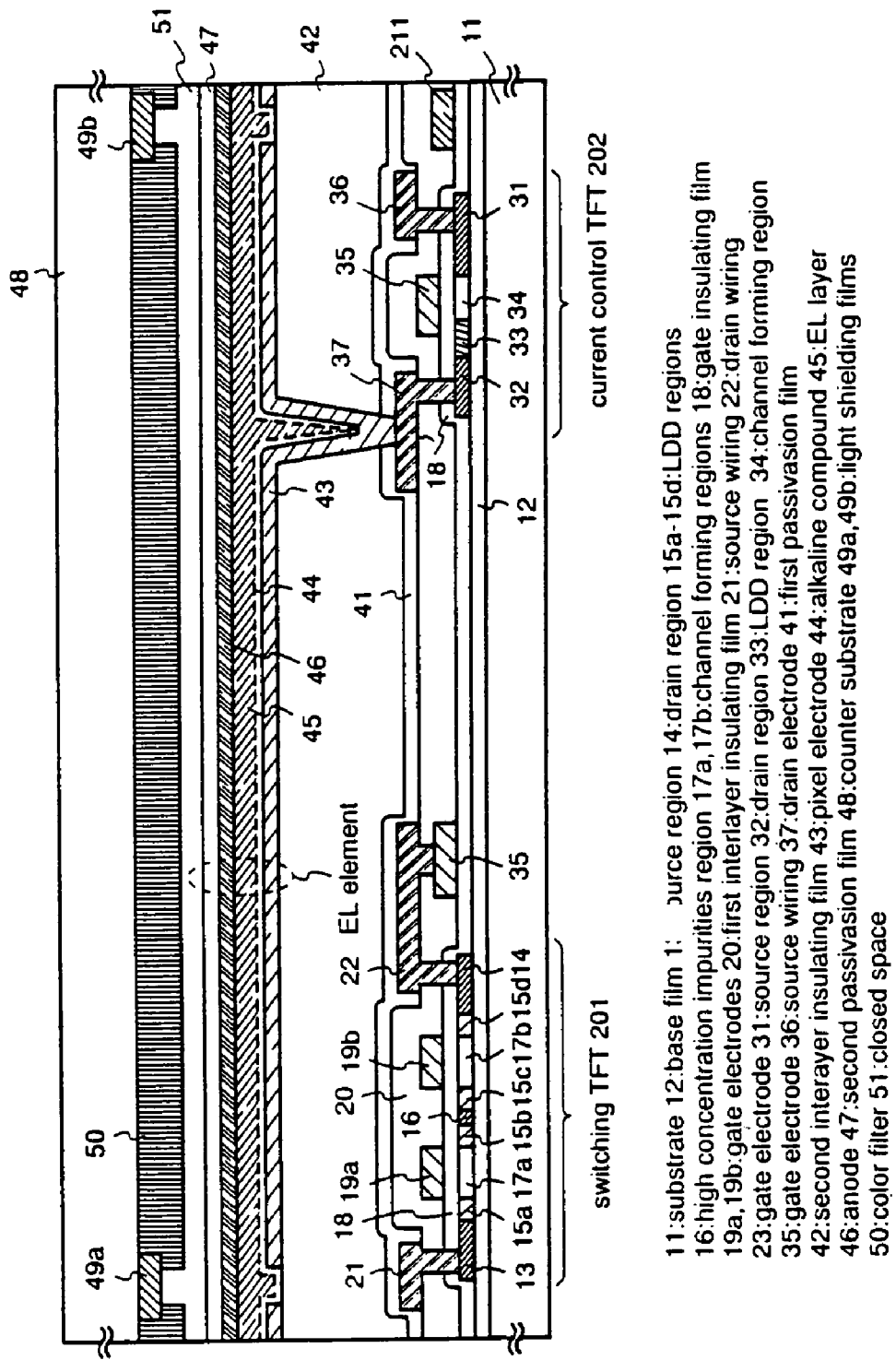

Fig.2

11:substrate 12:base film 13: source region 14:drain region 15a-15d:LDD regions
16:high concentration impurities region 17a,17b:channel forming regions 18:gate insulating film
19a,19b:gate electrodes 20:first interlayer insulating film 21:source wiring 22:drain wiring
23:gate electrode 31:source region 32:drain region 33:LDD region 34:channel forming region
35:gate electrode 36:source wiring 37:drain electrode 41:first passivasion film
42:second interayer insulating film 43:pixel electrode 44:alkaline compound 45:EL layer
46:anode 47:second passivasion film 48:counter substrate 49a,49b:light shielding films
50:color filter 51:closed space 300:glass substrate 301:base film 302:crystalline silicon film 303:protecting film 304a-304b:resist mask
305,306:n-type impurity regions (b) 307-310:active layers 311:gate insulating film 312-316:gate electrodes 317-323: n-type impurity regions(c) 324a-324d,332: resist mask 325-331: n-type impurity regions(a) 333,334: p-type i(a) 335: gate wiring 336:first interlayer insulating film 337-340:source wiring lines 341-343:drain wiring lines
344:first passivation film 345:second interlayer insulating film 346,347:pixel electrodes
348:alkaline compound 349:EL layer 350:anode 351:second passivation film 601:substrate 602:pixel portion 603:gate side driving curcuit
604:source side driving curcuit 605:switching TFT 606:gate
wiring line 607:source wiring line 608:current control TFT
609:power supply line 610:EL element 611:FPC
612-614:connection wiring

EL DISPLAY DEVICE INCLUDING COLOR FILTER AND LIGHT SHIELDING FILM

This application is a continuation of U.S. application Ser. No. 10/206,018, filed on Jul. 26, 2002 now U.S. Pat. No. 6,894,312 which is a continuation of U.S. application Ser. No. 09/661,022 filed on Sep. 13, 2000 (now U.S. Pat. No. 6,445,005 issued Sep. 3, 2002).

BACKGROUND OF THE INVENTION

1. Field of the Invention

The present invention relates to an EL (Electro-luminescence) display device formed by fabricating a semiconductor device (a device utilizing a semiconductor thin film; typically a thin film transistor) on a substrate, and an electronic device having such an EL display device as a display portion.

2. Description of the Related Art

A technique for forming a thin film transistor (hereinafter referred to as the TFT) on a substrate has been significantly improved in these days, and development for application thereof to an active matrix type display device has continued. In particular, a TFT utilizing a polysilicon film has a field effect mobility higher than that obtainable in a TFT utilizing a conventional amorphous silicon film, thereby realizing an operation at higher speed. Thus, it becomes possible to control pixels by a driving circuit formed on the identical substrate on which the pixels are formed, which is different from the conventional case in which the pixels are controlled by a driving circuit formed in the outside of the substrate.

Such an active matrix type display device has drawn much attention thereto since the device can realize various advantages, such as reduction in manufacturing cost, down-sizing of a display device, an improved yield, a reduced throughput or the like, by fabricating various circuits and devices on one and the same substrate.

In an active matrix EL display device, each pixel is provided with a switching device made of a TFT, and a driving device for controlling a current is activated by the switching device to cause an EL layer (more strictly speaking, a light emitting layer) to emit light. The EL display device is disclosed, for example, in Japanese Laid-open Patent Publication No. Hei 10-189252.

Thus, the present invention is intended to provide an inexpensive EL display device capable of displaying an image with high definition. Furthermore, the present invention is also intended to provide an electronic device having a high recognizability of a display portion by utilizing such an EL display device as the display portion.

SUMMARY OF THE INVENTION

The present invention will be described with reference to FIG. 1. In FIG. 1, reference numeral 101 denotes a substrate having an insulating surface. As the substrate 101, an insulating substrate such as a quartz substrate can be used. Alternatively, various kinds of substrate, such as a glass substrate, a semiconductor substrate, a ceramic substrate, a crystallized substrate, a metal substrate, or a plastic substrate, can be used by providing an insulating film on a surface thereof.

On the substrate 101, pixels 102 are formed. Although only three of the pixels are illustrated in FIG. 1, a higher number of pixels are actually formed in matrix. In addition, although one of these three pixels will be described below, the other pixels have the same structure.

In each of the pixels 102, two TFTs are formed; one of them is a switching TFT 103, and the other is a current control TFT 104. A drain of the switching TFT 103 is electrically connected to a gate of the current control TFT 104. Furthermore, a drain of the current control TFT 104 is electrically connected to a pixel electrode 105 (which in this case, also functions as a cathode of an EL element). The pixel 102 is thus formed.

Various wirings of the TFT as well as the pixel electrode can be formed of a metal film having a low resistivity. For example, an aluminum alloy film may be used for this purpose.

Following the fabrication of the pixel electrode 105, an insulating compound 106 (hereinbelow, referred to as the alkaline compound) including an alkali metal or an alkaline-earth metal over all of the pixel electrodes. Note that the outline of the alkaline compound is indicated by a dotted line in FIG. 1. This is because the alkaline compound 106 has a thickness which is as thin as several nm, and it is not known whether the compound 106 is formed as a layer or in an island-shape.

As the alkaline compound, lithium fluoride (LiF), lithium oxide ($Li_2O$), barium fluoride ($BaF_2$), barium oxide (BaO), calcium fluoride ($CaF_2$), calcium oxide (CaO), strontium oxide (SrO), or cesium oxide ($Cs_2O$) can be used. Since these are insulating materials, short-circuiting between the pixel electrodes does not occur even when the alkaline compound 106 is formed as a layer.

It is of course possible to use as a cathode a known conductive material as an MgAg electrode. However, in this case, the cathode itself has to be selectively formed or patterned into a certain shape in order to avoid short-circuiting between the pixel electrodes.

After the alkaline compound 106 is formed, an EL layer (Electro-luminescence layer) 107 is formed thereover. Although any known material and/or structure can be employed for the EL layer 107, a material capable of emitting white light is used in the present invention. As the structure, only a light emitting layer providing a field for recombination may be employed for the EL layer. If necessary, an electron injection layer, an electron transport layer, a hole transport layer, an electron blocking layer, a hole device layer, or a hole injection layer may be further layered. In the present specification, all of those layered intended to realize injection, transport or recombination of carriers are collectively referred to as the EL layer.

As an organic material to be used as the EL layer 107, either a low-molecule type organic material or a polymer type (high-molecule type) organic material can be used. However, it is desirable to use a polymer type organic material that can be formed by an easy formation technique such as a spin coat technique, a printing technique or the like. The structure illustrated in FIG. 1 is of the color display scheme in which an EL layer for emitting white light is combined with a color filter.

Alternatively, a color display scheme in which an EL layer for emitting blue or blue-green light is combined with fluorescent material (fluorescent color conversion layer; CCM), or another color display scheme in which EL layers respectively corresponding to RGB are overlaid one upon another to provide color display, can also be employed.

Over the EL layer 107, a transparent conductive film is formed as an anode 108. As the transparent conductive film, a compound of indium oxide and tin oxide (referred to as ITO), a compound of indium oxide and zinc oxide, tin oxide or zinc oxide can be used.

Over the anode 108, an insulating film as a passivation film 109 is provided. As the passivation film 109, a silicon nitride film or a silicon oxynitride film (represented as SiOxNy) is preferably used. Although a silicon oxide film may be used, an insulating film with as low an oxygen content as possible is preferred.

The substrate fabricated up to this stage is referred to as an active matrix substrate in the present application. More specifically, the substrate on which a TFT, a pixel electrode electrically connected to the TFT, and an EL element (a capacitor made of a cathode, an EL layer, and an anode) utilizing the pixel electrode as the cathode are formed is referred to as the active matrix substrate.

Furthermore, a counter substrate 110 is attached to the active matrix substrate with the EL element being interposed therebetween. The counter substrate 110 is provided with a light shielding film 112 and color filters 113a to 113c.

At this situation, the light shielding film 112 is provided so that a gap 111 formed between the pixel electrodes 105 is unseen from the viewing direction of an observer (i.e. from a direction normal to the counter substrate.) More specifically, the light shielding film 112 is provided to overlap (align with) the periphery of the pixel when viewed from the direction normal to the counter substrate. This is because this portion is non-emitting portion, and furthermore, electric field becomes complicated at the edge portion of the pixel electrode and thus light cannot be emitted with a desired luminance or chromaticity.

More specifically, by providing the light shielding film 112 at the position corresponding to the periphery (edge portion) of the pixel electrode 105 and the gap 111, contour between the pixels can be made clear. It can be also said that in the present invention, the light shielding film 112 is provided at the position corresponding to the periphery (edge portion) of the pixel because the contour of the pixel electrode corresponds to the contour of the pixel. Note that the position corresponding to the periphery of the pixel refers to the position aligned with the periphery of the pixel when viewed from the aforementioned direction which is normal to the counter substrate.

Among the color filters 113a to 113c, the color filter 113a is the one for obtaining red light, the color filter 113b is the one for obtaining green light, and the color filter 113c is the one for obtaining blue light. These color filters are formed at positions respectively corresponding to the different pixels 102, and thus, different color of light can be obtained for the respective pixels. In theory, this is the same as the color display scheme in a liquid crystal display device which uses color filters. Note that the position corresponding to the pixel refers to the position overlapped (aligned) with the pixel when viewed from the aforementioned direction which is normal to the counter substrate. More specifically, the color filters 113a to 113c are provided so as to overlap the pixels respectively corresponding thereto when viewed from the direction normal to the counter substrate.

Note that the color filter is a filter for improving the color purity of light which has passed therethrough by extracting light of a specific wavelength. Accordingly, in the case where the light component of the wavelength to be extracted is small, there may be disadvantages in which the light of that wavelength has extremely small luminance or deteriorated color purity. Thus, although no limitation is imposed to an EL layer for emitting white light which can be used in the present invention, it is preferable that the spectrum of the emitted white light includes emission spectrums of red, green and blue light components having as high purity as possible.

FIGS. 16A and 16B show typical x-y chromaticity diagrams of an EL layer to be used in the present invention. More specifically, FIG. 16A shows the chromaticity coordinate of light emitted from a known polymer type organic material for emitting white light. In the known material, the red color emission with high color purity cannot be realized. Therefore, yellow light or orange light is used instead of red light. Accordingly, white color obtained by adhesive color mixing seems to slightly include green color or yellow color. In addition, the respective emission spectrums of red light, green light, and blue light are so broad that it also becomes difficult to obtain monochromatic light having high purity when these light are mixed.

Accordingly, although sufficient color display can be realized even when an organic material as represented in the chromaticity diagram in FIG. 16A is used as an EL layer, it is now preferable to use as an EL layer an organic material as represented in the chromaticity diagram in FIG. 16B in order to realize brighter color display with higher purity.

The organic material as represented in the chromaticity diagram in FIG. 16B is an example in which an EL layer for emitting white light is formed by mixing organic materials capable of providing monochromatic light with high purity. In order to obtain light emission spectrums of red, green and blue colors having high color purity from a color filter, it is necessary to form an EL layer for emitting white light by mixing organic materials respectively exhibiting light emission spectrums of red, green and blue colors with high color purity. In addition, by using materials capable of providing a spectrum not only with high color purity but also with a narrow half-peak width, white color with a sharp spectrum can be reproduced. With this kind of the EL layer for emitting white light, the present invention can display a further brighter color image.

Furthermore, the color filters 113a to 113c can contain, as a drying agent, an oxide of an element in group I or II in periodic table, e.g., barium oxide, calcium oxide, lithium oxide or the like. In this case, a resin film containing a drying agent and a pigment of red, green or blue color may be used as a color filter.

Note that although not illustrated herein, the counter substrate 110 is adhered to the active matrix substrate by means of a sealing agent, so that a space designated with reference numeral 114 is a closed space.

As the counter substrate 110, it is necessary to use a transparent substrate so as not to prevent light from traveling. For example, a glass substrate, a quartz substrate, or a plastic substrate is preferably used. In addition, as the light shielding film 112, a thin film capable of satisfactorily shielding light, e.g., a titanium film, a resin film including a black-colored pigment or carbon. Similarly to the case of the above-mentioned color filters 113a to 113c, it is advantageous to provide the light shielding film 112 containing, as a drying agent, an oxide of an element in group I or II in periodic table, e.g., barium oxide, calcium oxide, lithium oxide or the like.

The closed space 114 may be filled with inert gas (noble gas or nitrogen gas), or with inert liquid. Alternatively, the closed space 114 may be filled with a transparent adhesive so as to adhere the whole surface of the substrate. Moreover, it is preferable to dispose a drying agent such as barium oxide in the closed space 114. Since the EL layer 107 is very vulnerable to water, it is highly desirable to prevent water from entering the closed space 114.

In the EL display device having the above-mentioned construction in accordance with the present invention, light emitted from the EL element passes through the counter substrate to be emitted toward an observer's eyes. Accordingly, the observer can recognize an image through the counter substrate. In this situation, one of the features of the EL display device in accordance with the present invention is that the light shielding film 112 is disposed between the EL element and the observer so as to conceal the gap 111 between the pixel electrodes 105. Thus, the contour between the pixels can be made clear, thereby resulting in an image display with high definition. This advantage can be obtained due to the light shielding film 112 provided at the counter substrate 110. When at least the light shielding film 112 is provided, this advantage can be obtained.

Furthermore, the light shielding film 112 and the color filters 113a to 113c are disposed at the counter substrate 110, and the counter substrate 110 also functions as a ceiling substrate for suppressing deterioration of the EL element. When the light shielding film 112 and the color filters 113a to 113c are disposed at the active matrix substrate, additional film-formation and patterning steps are required, whereas the number of fabrication steps for the active matrix substrate can be suppressed in the case where they are provided at the counter substrate, although additional film-formation and patterning steps are required.

Furthermore, the structure in accordance with the present invention in which the counter substrate 110 is provided with the light shielding film 112 and the color filters 113a to 113c and adhered to the active matrix substrate by means of the sealing agent has features common to the structure of a liquid crystal display device. Accordingly, it is possible to fabricate the EL display device of the present invention with most of an existing manufacturing line for liquid crystal display devices. Thus, an amount of equipment investment can be significantly reduced, thereby resulting in a reduction in the total manufacturing cost.

Thus, in accordance with the present invention, an inexpensive EL display device capable of displaying an image with high definition can be obtained. Furthermore, the present invention can also provide an electronic device having a high recognizability of a display portion by utilizing such an EL display device as the display portion.

BRIEF DESCRIPTION OF THE DRAWINGS

FIG. 2 is a view for illustrating the cross-sectional structure of a pixel of an EL display device.

DETAILED DESCRIPTION OF THE PREFERRED EMBODIMENTS

Figure 3A:
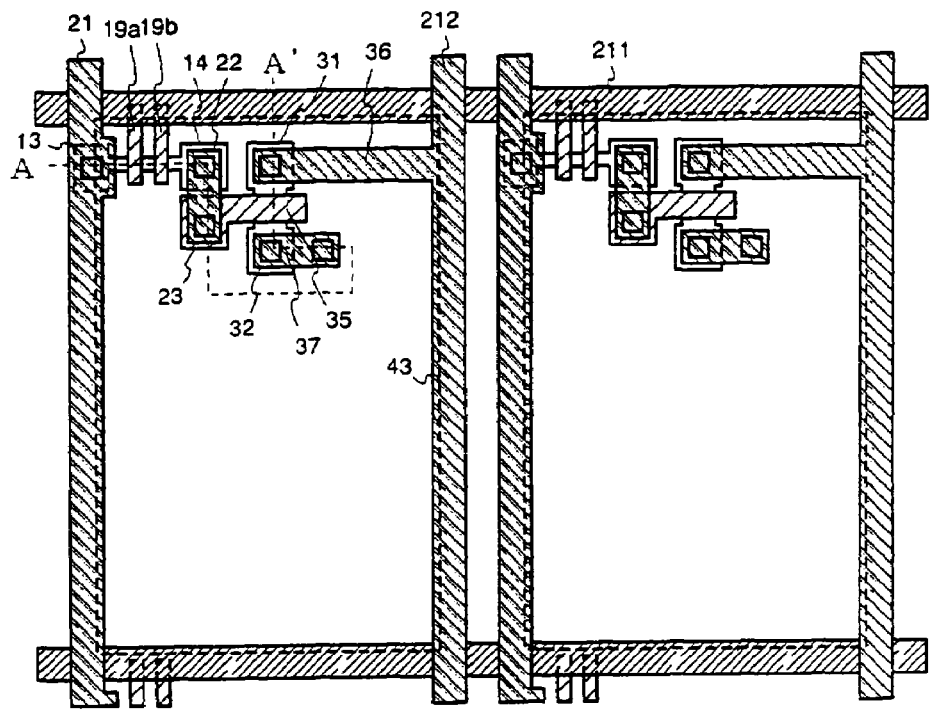
FIG. 3A is a view for illustrating the top structure of a pixel portion of an EL display device.
Figure 3B:
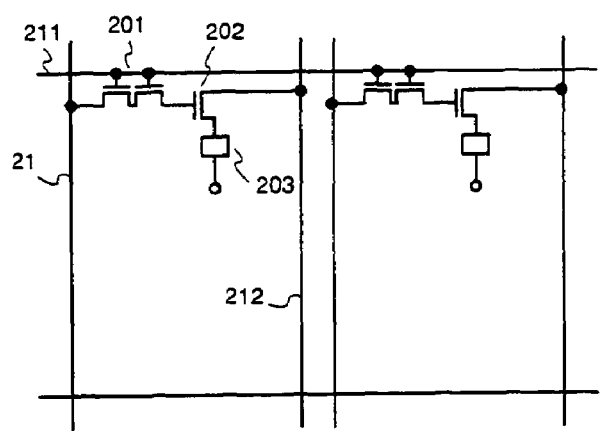
FIG. 3B is a view for illustrating the configuration of a pixel portion of an EL display device.

Some embodiments of the present invention will be described with reference to FIGS. 2, 3A and 3B. FIG. 2 shows a cross-sectional view of a pixel portion in an EL display device in accordance with the present invention. FIG. 3A shows a top view of the pixel portion, and FIG. 3B shows the circuit configuration thereof. In an actual structure, pixels are arranged in a plurality of lines to be in matrix, thereby forming a pixel portion (image display portion). FIG. 2 illustrates a cross-sectional view taken along the line A-A' in FIG. 3A. Accordingly, the same components are commonly designated by the same reference numerals in both of the figures, and it will be advantageous for understanding the structure to make reference to both of the figures. In addition, the two pixels illustrated in the top view of FIG. 3A have the same structure.

In FIG. 2, reference numeral 11 denotes a substrate, and 12 denotes a base insulating film (hereinafter referred to as the base film). As the substrate 11, a glass substrate, a glass ceramic substrate, a quartz substrate, a silicon substrate, a ceramic substrate, a metal substrate, or a plastic substrate (including a plastic film) can be used.

In addition, the base film 12 is especially advantageous for a substrate including mobile ions or a substrate having conductivity, but does not necessarily have to be provided for a quartz substrate. As the base film 12, an insulating film containing silicon may be used. In the present specification, the "insulating film containing silicon" refers to an insulating film containing silicon and oxygen or nitrogen at a predetermined ratio, and more specifically, a silicon oxide film, a silicon nitride film, or a silicon oxynitride film (represented as SiOxNy.)

It is advantageous to provide the base film 12 with a heat radiation function to dissipate heat generated in a TFT in order to prevent a TFT or an EL element from deteriorating. The heat radiation function can be provided by any known material.

In this example, two TFTs are provided in one pixel. A TFT 201 functions as a switching device (hereinafter referred to as the switching TFT), and a TFT 202 functions as a current controlling device for controlling an amount of current to flow through the EL element (hereinafter referred to as the current control TFT.) Both of the TFTs 201 and 202 are made of the n-channel type TFT.

Since the n-channel type TFT has a field effect mobility higher than that of the p-channel type TFT, the n-channel type TFT can operate at higher speed and accept a large amount of current. Furthermore, a current of the same amount can flow through the n-channel type TFT of smaller size as compared to the p-channel type TFT. Accordingly, it is preferable to use the n-channel type TFT as the current control TFT since this results in an increased effective area of the display portion.

The p-channel type TFT has advantages, e.g., in which the injection of hot carriers becomes hardly a problem and an OFF current value is small. Thus, it has been already reported the structures in which the p-channel type TFT is used as the switching TFT or the current control TFT. However, in the present invention, the disadvantages in connection with the injection of hot carriers and a small OFF current value can be overcome even in the n-channel type TFT by providing the structure with shifted LDD regions. Thus, it is another feature of the present invention in which all of the TFTs in the pixel are made of the n-channel type TFTs.

However, the present invention is not limited to the case where the switching TFT and the current control TFT are made of the n-channel type TFTs. It is possible to use the p-channel type TFT as both or either of the switching TFT and the current control TFT.

The switching TFT 201 is formed to have a source region 13, a drain region 14, an active layer including LDD regions 15a to 15d and a high concentration impurities region 16 and channel forming regions 17a and 17b, a gate insulating film 18, gate electrodes 19a and 19b, a first interlayer insulating film 20, a source wiring 21, and a drain wiring 22.

In addition, as shown in FIGS. 3A and 3B, the gate electrodes 19a and 19b are electrically connected to each other by means of a gate wiring 211 which is made of a different material (that has a lower resistivity than the gate electrodes 19a and 19b), thereby forming a double-gate structure. It is of course possible to employ, not only the double-gate structure, but also the so-called multigate structure (a structure including an active layer which contains two or more channel forming regions connected in series) such as a triple-gate structure. The multigate structure is significantly advantageous for decreasing of OFF current value. In accordance with the present invention, a switching device having a low OFF current value can be realized by providing the switching device 201 in the pixel with the multigate structure.

In addition, the active layer is formed of a semiconductor film that includes a crystalline structure. This may be a single crystalline semiconductor film, a polycrystalline semiconductor film, or a microcrystalline semiconductor film. The gate insulating film 18 may be formed of an insulating film containing silicon. Furthermore, any kind of conductive films can be used as the gate electrode, the source wiring, or the drain wiring.

Furthermore, in the switching TFT 201, the LDD regions 15a to 15d are disposed so as not overlap the gate electrodes 19a and 19b. Such a structure is significantly advantageous for reducing an OFF current value.

For reducing the OFF current value, it is further preferable to provide an offset region (which is made of a semiconductor layer having the same composition as the channel forming regions and a gate voltage is not applied thereto) between the channel forming regions and the LDD regions. In addition, in the case of the multigate structure having two or more gate electrodes, the high concentration impurities region disposed between the channel forming regions is effective for reducing the OFF current value.

As set forth above, by employing the TFT having the multigate structure as the switching device 201 in the pixel, a switching device having a sufficiently low OFF current value can be realized. Thus, a gate voltage of the current control TFT can be maintained for a sufficient period of time (from the timing selected until the next timing selected) without providing a capacitor as shown in FIG. 2 of Japanese Laid-Open Patent Publication No. Hei 10-189252.

Then, the current control TFT 202 is formed to have a source region 31, a drain region 32, an active layer including an LDD region 33 and a channel forming region 34, a gate insulating film 18, a gate electrode 35, a first interlayer insulating film 20, a source wiring 36, and a drain wiring 37. Although the illustrated gate electrode 35 has the single gate structure, it may have the multi-gate structure.

As shown in FIG. 2, a drain of the switching TFT is connected to a gate of the current control TFT. More specifically, the gate electrode 35 is electrically connected to the drain region 14 of the switching TFT 201 through the drain wiring 22 (also referred to as the connecting wiring). Furthermore, the source wiring 36 is connected to a power supply line 212.

The current control TFT 202 is a device intended to control an amount of current to be injected into the EL element 203. However, considering possible deterioration of the EL element, it is not preferable to allow a large amount of current to flow. Accordingly, in order to prevent excessive current from flowing through the current control TFT 202, the channel length (L) thereof is preferably designed to be long. Desirably, the channel length (L) is design to be 0.5 to 2 μm (preferably, 1 to 1.5 μm) long per pixel.

Figure 9:
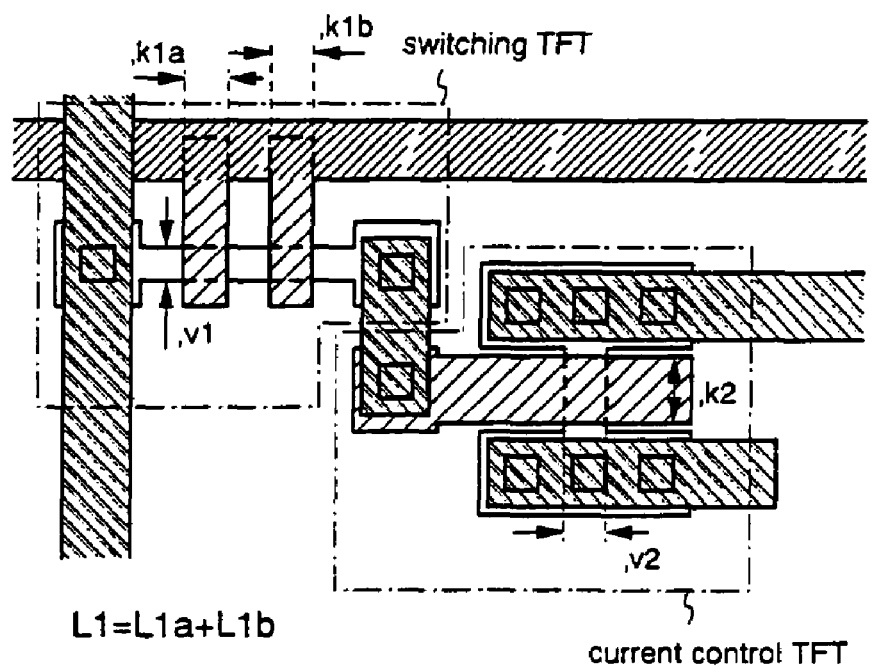
FIG. 9 is an enlarged view of a pixel of an EL display device.

In view of the above-mentioned description, as shown in FIG. 9, the channel length L1 (where L1=L1a+L1b) and the channel width W1 of the switching TFT, and the channel length L2 and the channel width W2 of the current control TFT are preferably set as follows: W1 is in the range from 0.1 to 5 μm (typically, 0.5 to 2 μm); W2 is in the range from 0.5 to 10 μm (typically, 2 to 5 μm); L1 is in the range from 0.2 to 18 μm (typically, 2 to 15 μm); and L2 is in the range from 1 to 50 μm (typically, 10 to 30 μm). However, the present invention is not limited to the above-mentioned values.

The length (width) of the LDD regions to be formed in the switching TFT 201 is set in the range from 0.5 to 3.5 μm, typically in the range from 2.0 to 2.5 μm.

The EL display device as shown in FIG. 2 has features in which the LDD region 33 is provided between the drain region 32 and the channel forming region 34 in the current control TFT 202, and part of the LDD region 33 overlaps the gate electrode 35 through the gate insulating film 18 while the remaining portion does not.

The current control TFT 202 supplies a current to the EL element 203 for causing it to emit light, and at the same time controls the supplied amount of the current to realize gray scale display. For that purpose, it is necessary to implement countermeasure against deterioration due to the injection of hot carriers so as not to deteriorate when the current flows. Further, in the case where black color is displayed by turning off the current control TFT 202, a high OFF current value prevents black color from being displayed in satisfactory condition, resulting in disadvantages such as reduced contrast. Accordingly, it is also necessary suppress the OFF current value.

With respect to the deterioration due to the injection of hot carriers, it has been known that the structure with the LDD region overlapping the gate electrode is very effective. However, when the whole LDD region overlaps the gate electrode, the OFF current value increases. Thus, the present inventors overcome both the disadvantage related to the hot carriers and the disadvantage related to the OFF current value by providing a novel structure with the LDD regions being disposed in series so as not to overlap the gate electrode.

In this case, the length of the LDD region overlapping the gate electrode may be set to be in the range from 0.1 to 3 μm (preferably in the range of 0.3 to 1.5 μm). If the overlap length is too long, parasitic capacitance is increased, whereas when the overlap length is too short, hot carriers cannot be sufficiently suppressed. Furthermore, a region of the LDD not overlapping the gate electrode may be set to be in the range from 1.0 to 3.5 μm (preferably in the range of 1.5 to 2.0 μm). If this length is too long, a sufficient current cannot flow, whereas when this length is too short, the OFF current value cannot be sufficiently reduced.

Furthermore, in the above structure, a parasitic capacitance is generated in the region where the gate electrode overlaps the LDD region, and therefore, such an overlap region should not be provided between the source region 31 and the channel forming region 34. Since carriers (electrons) always travel in the same direction in the current control TFT, it is sufficient to provide the LDD region only on the side closer to the drain region.

From the view point of increasing a possible amount of current to flow, it is also effective to increase film thickness of the active layer (in particular, a thickness at the channel forming region) of the current control TFT 202 (preferably in the range from 50 to 100 nm, and more preferably in the range from 60 to 80 nm). On the other hand, in the case of the switching TFT 201, from the view point of reducing an OFF current value, it is also effective to decrease film thickness of the active layer (in particular, a thickness at the channel forming region) of the current control TFT 202 (preferably in the range from 20 to 50 nm, and more preferably in the range from 25 to 40 nm.)

Then, reference numeral 41 denotes the first passivation film, which may have a thickness of 10 nm to 1 µm (preferably 200 to 500 nm). As the constituent material thereof, an insulating film containing silicon can be used (particularly, a silicon oxynitride film or a silicon nitride film is preferred). It is effective to provide this passivation film 41 with the heat radiation effect for preventing the EL layer from thermal degradation.

A thin film exhibiting the heat radiation effect includes an insulating film containing at least one element selected from B (boron), C (carbon), and N (nitrogen), as well as at least one element selected from Al (aluminum), Si (silicon), and P (phosphorous). For example, it is possible to use a nitride of aluminum, typically aluminum nitride (AlxNy); a carbide of silicon, typically silicon carbide (SixCy); a nitride of silicon, typically silicon nitride (SixNy); a nitride of boron, typically boron nitride (BxNy); and a phosphide of boron, typically boron phosphide (BxPy). Furthermore, an oxide of aluminum, typically aluminum oxide (AlxOy) has a thermal conductivity of 20 $Wm^{-1}K^{-1}$, and can be one of preferable materials. In the above-mentioned transparent materials, x and y can be any integer.

Note that it is also possible to combine the above compound with another element. For example, it is also possible to use aluminum nitride oxide indicated by AlNxOy by adding nitrogen to the aluminum oxide. Note that in the above aluminum nitride oxide, x and y are respectively arbitrary integers.

Besides, it is possible to use materials disclosed in Japanese Laid-open Patent Publication No. Sho 62-90260. That is, it is also possible to use an insulating film containing Si, Al, N, O, or M (M is at least one kind of rare-earth element, preferably at least one element selected from Ce (cerium), Yb (ytterbium), Sm (samarium), Er (erbium), Y (yttrium), La (lantern), Gd (gadolinium), Dy (dysprosium), and Nd (neodymium)).

Besides, it is also possible to use a carbon film such as a diamond thin film or an amorphous carbon film (especially a film having characteristics close to diamond, called diamond-like carbon or the like). These have very high thermal conductivity and are very effective as a heat radiating layer.

Thus, although a thin film made of the material having the foregoing heat radiating effect can be used alone, it is effective to stack these thin films and a silicon nitride film (SixNy) or silicon nitride oxide film (SiOxNy). Note that in the silicon nitride film or silicon nitride oxide film, x and y are respectively arbitrary integers.

Over the first passivation film 41, a second interlayer insulating film 42 (also referred to as a planarizing film) is formed to cover the respective TFTs, and thus steps caused by the TFTs are planarized. As the second interlayer insulating film 42, an organic resin film is preferred, and polyimide, polyamide, acrylic, BCB (benzocyclobutane), or the like can be used. An inorganic film can be also used of course, so long as sufficient planarization is realized.

The planarization of the steps caused by the TFTs by means of the second interlayer insulating film 42 is very important. The EL layer to be formed in the subsequent step is so thin that the steps may cause to defect in light emission. Accordingly, in order to form the EL layer on a flat surface as much as possible, it is preferable to perform a planarization process prior to the formation of the pixel electrode.

Reference numeral 43 denotes the pixel electrode (corresponding to the cathode of the EL element) made of a conductive film having a function to shield light. The pixel electrode 43 is formed, after contact holes (openings) are provided in the second interlayer insulating film 42 and the first passivation film 41, to be connected the drain wiring 37 of the current control TFT 202 in the thus formed opening portion.

A lithium fluoride film having a thickness of 5 to 10 nm is formed by a vapor deposition method as the alkaline compound 44 on the pixel electrode 43. The lithium fluoride film is an insulating film, and thus, when the thickness thereof is too large, a current cannot flow to the EL layer. No adverse effect is generated even when the lithium fluoride film is formed in an island-like pattern, not in a layer.

The EL layer 45 is then formed. In the present embodiment, a polymer type organic material is formed through a spin coat technique. Any known material can be used as the polymer type organic material. Although a single layer of the light emitting layer is used as the EL layer 45 in the present embodiment, the laminated structure in which the light emitting layer is combined with a hole transport layer, or an electron transport layer provides a higher light emission efficiency. When the polymer type organic material is to be laminated, it is preferable to be combined with a low molecule organic material formed by a vapor deposition technique. With the spin coat technique, if there is the base organic material, it may re-melt since the organic material to form the EL layer is mixed with an organic solvent and coated.

A typical polymer type organic material that can be used in the present embodiment includes high molecule material such as polyparaphenylene vinylene (PPV) type, polyvinyl carbazole (PVK) type, polyfluorene type, or the like. In order to form an electron transport layer, a light emitting layer, a hole transport layer or a hole injection layer with these polymer type organic materials, the organic material may be coated in the form of polymer precursor, and then heated (baked) in vacuum to be converted into the polymer type organic material.

More specifically, as the polymer type organic material for providing light of white color to be a light emitting layer, the materials disclosed in Japanese Laid-Open Patent Publication No. Hei 8-96959 or No. Hei 9-63770 can be used. For example, the material obtained by solving PVK (polyvinyl carbazole), Bu-PBD (2-(4'-tert-butylphenyl)-5-(4"-biphenyl)-1,3,4-oxydiazole), coumarin 6, DCM 1 (4-dicyanomethylene-2-methyl-6-p-dimethyl aminostilyl-4H-pyran), TPB (tetra phenyl butadiene), and Nile Red into 1,2-dichloromethane can be used. The thickness of the above material can be set to be in the range from 30 to 150 nm (preferably 40 to 100 nm). As the hole transport layer, polytetra hydrothiophenyl phenylene that is the polymer precursor, is used, which is heated to be converted into polyphenylene vinylene. The thickness thereof can be set to be in the range from 30 to 100 nm (preferably 40 to 80 nm).

Thus, the polymer type organic material is advantageous especially for emitting white light since color adjustment can be easily performed by adding a fluorescent pigment into a solution in which a host material is solved. Although the EL element is formed by using the polymer type organic material in the above description, any low molecule type organic material can be used. Moreover, the EL layer can be formed with an inorganic material.

The above-mentioned organic materials are only examples that can be used for the EL layer in accordance with the present invention. Note that the present invention is not limited thereto.

When the EL layer 45 is formed, it is desirable that the process is proceeded in a dry inert gas atmosphere containing water as less as possible. The EL layer is likely to easily deteriorate due to water or oxygen existing in the surrounding atmosphere, and therefore, those factors should be eliminated as much as possible in the formation of the EL layer. For example, a dry nitrogen atmosphere, a dry argon atmosphere, or the like is preferred. For that purpose, it is preferable to place a coating process chamber and a baking process chamber in a clean booth filled with inert gas and the process is proceeded in the above-mentioned atmosphere.

After the EL layer 45 is formed in the above-mentioned manner, the anode 46 made of a transparent conductive film, as well as the second passivation film 47, are formed. In the present embodiment, the anode 46 is formed of a conductive film made of a compound of indium oxide and zinc oxide. A small amount of gallium may be added thereto. As the second passivation film 47, a silicon nitride film having a thickness of 10 nm to 1 μm (preferably 200 to 500 nm) can be used.

Since the EL layer is vulnerable to heat as explained above, it is desirable to deposit the anode 46 and the second passivation film 47 at a temperature of as low as possible (preferably in the range from room temperature to 120° C.). Accordingly, it can be said that a plasma CVD technique, a vacuum vapor deposition technique, or a solution coating (spin coat) technique is a preferred technique for the film formation.

The counter substrate 48 is disposed to face the active matrix substrate thus completed. In the present embodiment, a glass substrate is used as the counter substrate 48. Furthermore, the counter substrate 48 is provided with light shielding films 49a and 49b made of resin with a black-colored pigment being dispersed therein, and a color filter 50 made of resin with a red-colored, green-colored, or blue-colored pigment being dispersed therein. These light shielding films 49a and 49b are disposed so as to conceal a gap between the pixel electrode 43 and its adjacent pixel electrode. At this time, it is advantageous that the light shielding films 49a and 49b contain a drying agent such as barium oxide or the like. Other material such as those disclosed in Japanese Laid-Open Patent Publication No. Hei 9-148066 can be used as the drying agent. Furthermore, the color filter 50 is formed at the position corresponding to the pixel 102.

The active matrix substrate is adhered to the counter substrate 48 by means of a sealing agent (not illustrated) to form a closed space 51. In the present embodiment, the closed space is filled with argon gas. It is of course possible to place the above-mentioned drying agent in the closed space 51.

The EL display device in accordance with the present embodiment includes a pixel portion composed of pixels each having the structure as shown in FIG. 2, in which the TFTs having the different structures in accordance with their functions in pixels are arranged. More specifically, the switching TFT having a sufficiently low OFF current value and the current control TFT which is not vulnerable to the injection of hot carriers are formed in the same pixel. Thus, the EL display device with high reliability capable of displaying an image with high definition can be obtained.

Embodiment 1

The embodiments of the present invention are explained using FIGS. 4A to 6C. A method of simultaneous manufacture of a pixel portion, and TFTs of a driving circuit portion formed in the periphery of the pixel portion, is explained here. Note that in order to simplify the explanation, a CMOS circuit is shown as a basic circuit for the driving circuits.

Figure 4A:
FIGS. 4A through 4E are views for illustrating the fabricating steps of an active matrix type EL display device.

First, as shown in FIG. 4A, a base film 301 is formed with a 300 nm thickness on a glass substrate 300. Oxidized silicon nitride films are laminated as the base film 301 in embodiment 1. It is good to set the nitrogen concentration at between 10 and 25 wt % in the film contacting the glass substrate 300.

Besides, as a part of the base film 301, it is effective to provide an insulating film made of a material similar to the first passivation film 41 shown in FIG. 2. The current controlling TFT is apt to generate heat since a large current is made to flow, and it is effective to provide an insulating film having a heat radiating effect at a place as close as possible.

Next, an amorphous silicon film (not shown in the figures) is formed with a thickness of 50 nm on the base film 301 by a known deposition method. Note that it is not necessary to limit this to the amorphous silicon film, and another film may be formed provided that it is a semiconductor film containing an amorphous structure (including a microcrystalline semiconductor film). In addition, a compound semiconductor film containing an amorphous structure, such as an amorphous silicon germanium film, may also be used. Further, the film thickness may be made from 20 to 100 nm.

The amorphous silicon film is then crystallized by a known method, forming a crystalline silicon film (also referred to as a polycrystalline silicon film or a polysilicon film) 302. Thermal crystallization using an electric furnace, laser annealing crystallization using a laser, and lamp annealing crystallization using an infrared lamp exist as known crystallization methods. Crystallization is performed in embodiment 1 using an excimer laser light which uses XeCl gas.

Note that pulse emission type excimer laser light formed into a linear shape is used in embodiment 1, but a rectangular shape may also be used, and continuous emission argon laser light and continuous emission excimer laser light can also be used.

In this embodiment, although the crystalline silicon film is used as the active layer of the TFT, it is also possible to use an amorphous silicon film. Further, it is possible to form the active layer of the switching TFT, in which there is a necessity to reduce the off current, by the amorphous silicon film, and to form the active layer of the current control TFT by the crystalline silicon film. Electric current flows with difficulty in the amorphous silicon film because the carrier mobility is low, and the off current does not easily flow. In other words, the most can be made of the advantages of both the amorphous silicon film, through which current does not flow easily, and the crystalline silicon film, through which current easily flows.

Figure 4B:
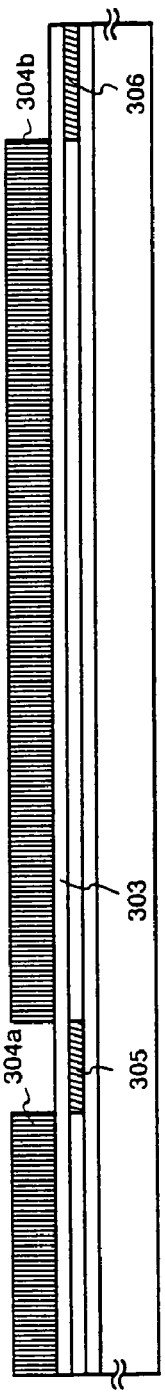

Next, as shown in FIG. 4B, a protecting film 303 is formed on the crystalline silicon film 302 with a silicon oxide film having a thickness of 130 nm. This thickness may be chosen within the range of 100 to 200 nm (preferably between 130 and 170 nm). Furthermore, other films may also be used providing that they are insulating films containing silicon.

The protecting film 303 is formed so that the crystalline silicon film is not directly exposed to plasma during addition of an impurity, and so that it is possible to have delicate concentration control of the impurity.

Resist masks 304a and 304b are then formed on the protecting film 303, and an impurity element which imparts n-type conductivity (hereafter referred to as an n-type impurity element) is added. Note that elements residing in periodic table group 15 are generally used as the n-type impurity element, and typically phosphorous or arsenic can be used. Note that a plasma doping method is used, in which phosphine ($PH_3$) is plasma activated without separation of mass, and phosphorous is added at a concentration of $1\times10^{18}$ atoms/$cm^3$ in embodiment 1. An ion implantation method, in which separation of mass is performed, may also be used, of course.

The dose amount is regulated so that the n-type impurity element is contained in n-type impurity regions 305 and 306, thus formed by this process, at a concentration of $2\times10^{16}$ to $5\times10^{19}$ atoms/$cm^3$ (typically between $5\times10^{17}$ and $5\times10^{18}$ atoms/$cm^3$).

Figure 4C:

Next, as shown in FIG. 4C, the protecting film 303 is removed, and an activation of the added periodic table group 15 elements is performed. A known technique of activation may be used as the means of activation, but activation is done in embodiment 1 by irradiation of excimer laser light. Of course, a pulse emission type excimer laser and a continuous emission type excimer laser may both, be used, and it is not necessary to place any limits on the use of excimer laser light. The goal is the activation of the added impurity element, and it is preferable that irradiation is performed at an energy level at which the crystalline silicon film does not melt. Note that the laser irradiation may also be performed with the protecting film 303 in place.

The activation by heat treatment may also be performed along with activation of the impurity element by laser light. When activation is performed by heat treatment, considering the heat resistance of the substrate, it is good to perform heat treatment on the order of 450 to 550° C.

A boundary portion (connecting portion) with end portions of the n-type impurity regions 305 and 306, namely regions, in which the n-type impurity element is not added, on the periphery of the n-type impurity regions 305 and 306, is not added, is delineated by this process. This means that, at the point when the TFTs are later completed, extremely good connections can be formed between LDD regions and channel forming regions.

Figure 4D:
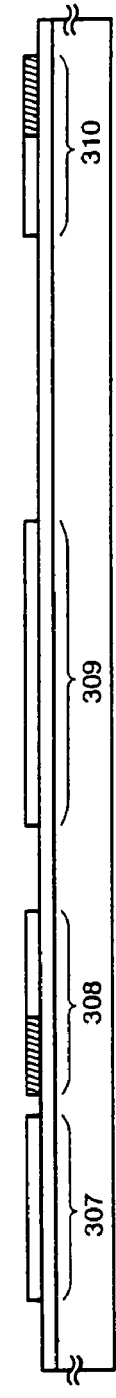

Unnecessary portions of the crystalline silicon film are removed next, as shown in FIG. 4D, and island shape semiconductor films (hereafter referred to as active layers) 307 to 310 are formed.

Figure 4E:
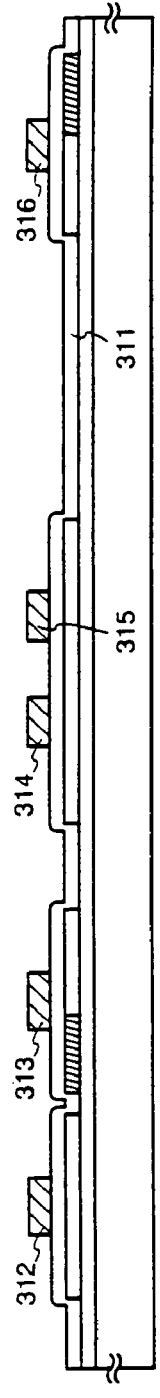

Then, as shown in FIG. 4E, a gate insulating film 311 is formed, covering the active layers 307 to 310. An insulating film containing silicon and with a thickness of 10 to 200 nm, preferably between 50 and 150 nm, may be used as the gate insulating film 311. A single layer structure or a lamination structure may be used. A 110 nm thick oxidized silicon nitride film is used in embodiment 1.

Thereafter, a conductive film having a thickness of 200 to 400 nm is formed and patterned to form gate electrodes 312 to 316. Respective end portions of these gate electrodes 312 to 316 may be tapered. In the present embodiment, the gate electrodes and wirings (hereinafter referred to as the gate wirings) electrically connected to the gate electrodes for providing conducting paths are formed of different materials from each other. More specifically, the gate wirings are made of a material having a lower resistivity than the gate electrodes. Thus, a material enabling fine processing is used for the gate electrodes, while the gate wirings are formed of a material that can provide a smaller wiring resistance but is not suitable for fine processing. It is of course possible to form the gate electrodes and the gate wirings with the same material.

Although the gate electrode can be made of a single-layered conductive film, it is preferable to form a lamination film with two, three or more layers for the gate electrode if necessary. Any known conductive materials can be used for the gate electrode. It should be noted, however, that it is preferable to use such a material that enables fine processing, and more specifically, a material that can be patterned with a line width of 2 μm or less.

Typically, it is possible to use a film made of an element selected from tantalum (Ta), titanium (Ti), molybdenum (Mo), tungsten (W), chromium (Cr), and silicon (Si), a film of nitride of the above element (typically a tantalum nitride film, tungsten nitride film, or titanium nitride film), an alloy film of combination of the above elements (typically Mo—W alloy, Mo—Ta alloy), or a silicide film of the above element (typically a tungsten silicide film or titanium silicide film). Of course, the films may be used as a single layer or a laminate layer.

In this embodiment, a laminate film of a tungsten nitride (WN) film having a thickness of 50 mm and a tungsten (W) film having a thickness of 350 nm is used. This may be formed by a sputtering method. When an inert gas of Xe, Ne or the like is added as a sputtering gas, film peeling due to stress can be prevented.

The gate electrodes 313 and 316 are formed at this time so as to overlap a portion of the n-type impurity regions 305 and 306, respectively, sandwiching the gate insulating film 311. This overlapping portion later becomes an LDD region overlapping the gate electrode.

Figure 5A:
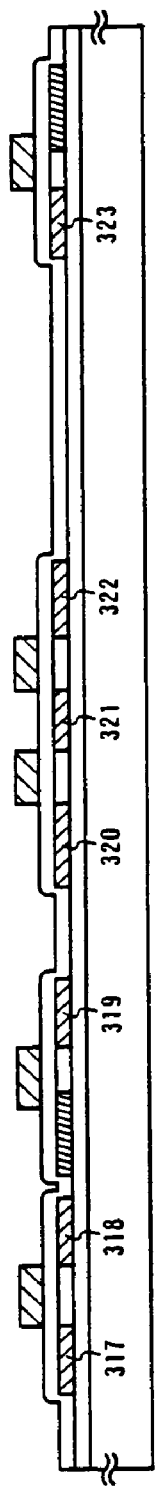
FIGS. 5A through 5D are views for illustrating the fabricating steps of an active matrix type EL display device.

Next, an n-type impurity element (phosphorous is used in embodiment 1) is added in a self-aligning manner with the gate electrodes 312 to 316 as masks, as shown in FIG. 5A. The addition is regulated so that phosphorous is added to impurity regions 317 to 323 thus formed at a concentration of 1/10 to 1/2 that of the impurity regions 305 and 306 (typically between 1/4 and 1/3). Specifically, a concentration of $1\times10^{16}$ to $5\times10^{18}$ atoms/$cm^3$ (typically $3\times10^{17}$ to $3\times10^{18}$ atoms/$cm^3$) is preferable.

Figure 5B:
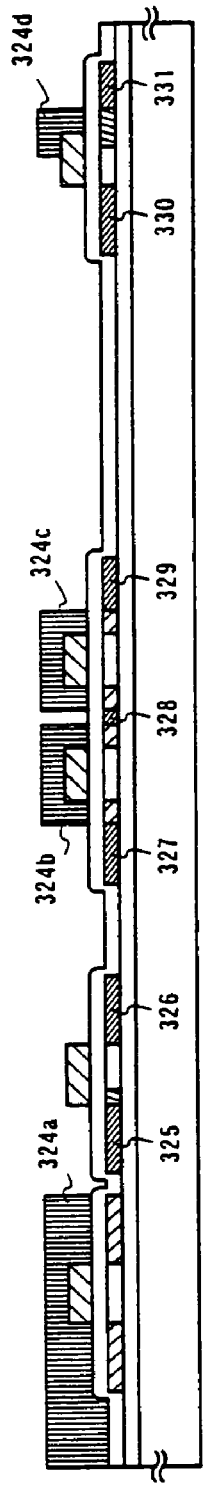

Resist masks 324a to 324c are formed next, with a shape covering the gate electrodes etc., as shown in FIG. 5B, and an n-type impurity element (phosphorous is used in embodiment 1) is added, forming impurity regions 325 to 331 containing phosphorous at high concentration of phosphorous. Ion doping using phosphine ($PH_3$) is also performed here, and is regulated so that the phosphorous concentration of these regions is from $1\times10^{20}$ to $1\times10^{21}$ atoms/$cm^3$ (typically between $2\times10^{20}$ and $5\times10^{21}$ atoms/$cm^3$).

A source region or a drain region of the n-channel type TFT is formed by this process, and in the switching TFT, a portion of the n-type impurity regions 320 to 322 formed by the process of FIG. 5A are remained. These remaining regions correspond to the LDD regions 15a to 15d of the switching TFT in FIG. 2.

Figure 5C:
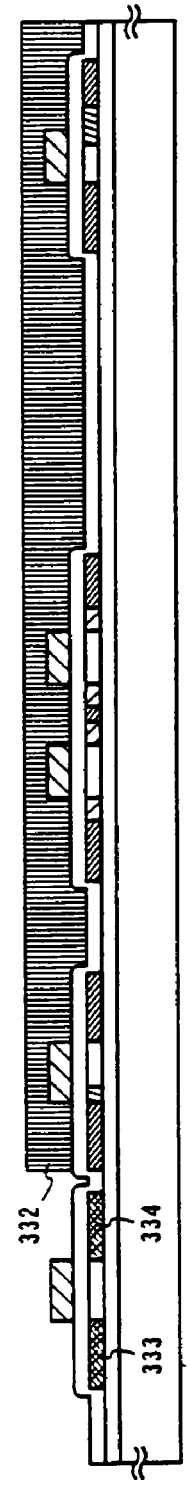
Figure 5D:
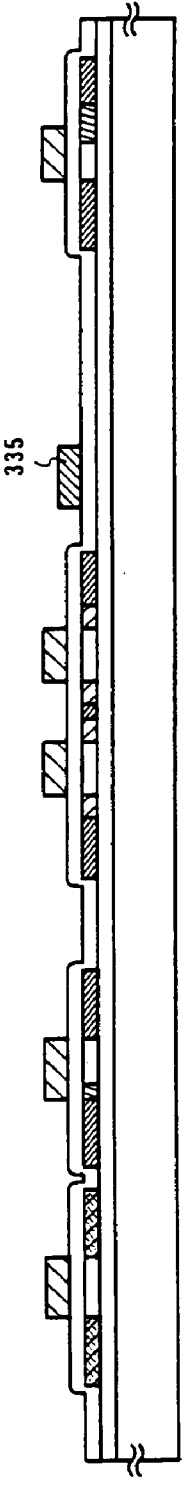

Next, as shown in FIG. 5C, the resist masks 324a to 324c are removed, and a new resist mask 332 is formed. A p-type impurity element (boron is used in embodiment 1) is then added, forming impurity regions 333 and 334 containing boron at high concentration. Boron is added here to form impurity regions 333 and 334 at a concentration of $3\times10^{20}$ to $3\times10^{21}$ atoms/$cm^3$ (typically between $5\times10^{20}$ and $1\times10^{21}$ atoms/$cm^3$) by ion doping using diborane ($B_2H_6$).

Note that phosphorous has already been added to the impurity regions 333 and 334 at a concentration of $1\times10^{20}$ to $1\times10^{21}$ atoms/cm$^3$, but boron is added here at a concentration of at least 3 times that of the phosphorous. Therefore, the n-type impurity regions already formed completely invert to p-type, and function as p-type impurity regions.

Next, after removing the resist mask 332, the n-type and p-type impurity elements added to the active layer at respective concentrations are activated. Furnace annealing, laser annealing or lamp annealing can be used as a means of activation. In embodiment 1, heat treatment is performed for 4 hours at 550° C. in a nitrogen atmosphere in an electric furnace.

At this time, it is critical to eliminate oxygen from the surrounding atmosphere as much as possible. This is because when even only a small amount of oxygen exists, an exposed surface of the gate electrode is oxidized, which results in an increased resistance and later makes it difficult to form an ohmic contact with the gate electrode. Accordingly, the oxygen concentration in the surrounding atmosphere for the activation process is set at 1 ppm or less, preferably at 0.1 ppm or less.

After the activation process is completed, the gate wiring 335 having a thickness of 300 nm is formed. As a material for the gate wiring 335, a metal film containing aluminum (Al) or copper (Cu) as its main component (occupied 50 to 100% in the composition) can be used. The gate wiring 335 is arranged, as the gate wiring 211 shown in FIG. 3A, so as to provide electrical connection for the gate electrodes 314 and 315 (corresponding to the gate electrodes 19a and 19b in FIG. 3A) of the switching TFT (see FIG. 5D).

The above-described structure can allow the wiring resistance of the gate wiring to be significantly reduced, and therefore, an image display region (pixel portion) with a large area can be formed. More specifically, the pixel structure in accordance with the present embodiment is advantageous for realizing an EL display device having a display screen with a diagonal size of 10 inches or larger (or 30 inches or larger.)

Figure 6A:
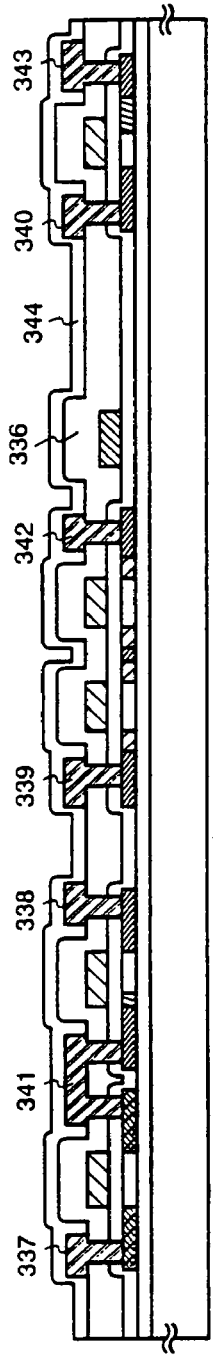
FIGS. 6A through 6C are views for illustrating the fabricating steps of an active matrix type EL display device.

A first interlayer insulating film 336 is formed next, as shown in FIG. 6A. A single layer insulating film containing silicon is used as the first interlayer insulating film 336, while a lamination film may be used. Further, a film thickness of between 400 nm and 1.5 μm may be used. A lamination structure of an 800 nm thick silicon oxide film on a 200 nm thick oxidized silicon nitride film is used in embodiment 1.

In addition, heat treatment is performed for 1 to 12 hours at 300 to 450° C. in an atmosphere containing between 3 and 100% hydrogen, performing hydrogenation. This process is one of hydrogen termination of dangling bonds in the semiconductor film by hydrogen which is thermally activated. Plasma hydrogenation (using hydrogen activated by a plasma) may also be performed as another means of hydrogenation.

Note that the hydrogenation processing may also be inserted during the formation of the first interlayer insulating film 336. Namely, hydrogen processing may be performed as above after forming the 200 nm thick oxidized silicon nitride film, and then the remaining 800 nm thick silicon oxide film may be formed.

Next, a contact hole is formed in the first interlayer insulating film 336, and source wiring lines 337 to 340 and drain wiring lines 341 to 343 are formed. In this embodiment, this electrode is made of a laminate film of three-layer structure in which a titanium film having a thickness of 100 nm, an aluminum film containing titanium and having a thickness of 300 nm, and a titanium film having a thickness of 150 nm are continuously formed by a sputtering method. Of course, other conductive films may be used.

A first passivation film 344 is formed next with a thickness of 50 to 500 nm (typically between 200 and 300 nm). A 300 nm thick oxidized silicon nitride film is used as the first passivation film 344 in embodiment 1. This may also be substituted by a silicon nitride film. It is of course possible to use the same materials as those of the first passivation film 41 of FIG. 2.

Note that it is effective to perform plasma processing using a gas containing hydrogen such as $H_2$ or $NH_3$ etc. before the formation of the oxidized silicon nitride film. Hydrogen activated by this preprocess is supplied to the first interlayer insulating film 336, and the film quality of the first passivation film 344 is improved by performing heat treatment. At the same time, the hydrogen added to the first interlayer insulating film 336 diffuses to the lower side, and the active layers can be hydrogenated effectively.

Figure 6B:
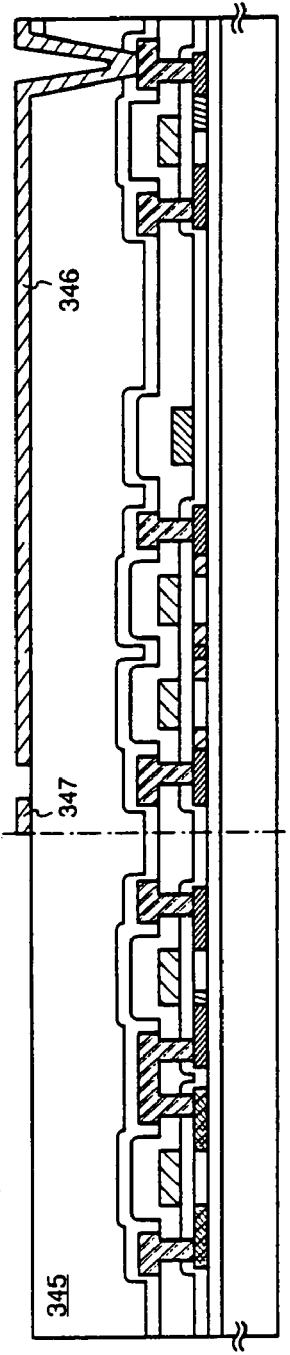

Next, as shown in FIG. 6B, a second interlayer insulating film 345 made of organic resin is formed. As the organic resin, it is possible to use polyimide, polyamide, acryl, BCB (benzocyclobutene) or the like. Especially, since the second interlayer insulating film 345 is primarily used for flattening, acryl excellent in flattening properties is preferable. In this embodiment, an acrylic film is formed to a thickness sufficient to flatten a stepped portion formed by TFTs. It is appropriate that the thickness is made 1 to 5 μm (more preferably, 2 to 4 μm).

Thereafter, a contact hole is formed in the second interlayer insulating film 345 and the first passivation film 344 to reach the drain wiring 343, and then the pixel electrode 346 is formed. In the present embodiment, an aluminum alloy film (an aluminum film containing titanium of 1 wt %) having a thickness of 300 nm is formed as the pixel electrode 346. Reference numeral 347 denotes an end portion of the adjacent pixel electrode.

Figure 6C:
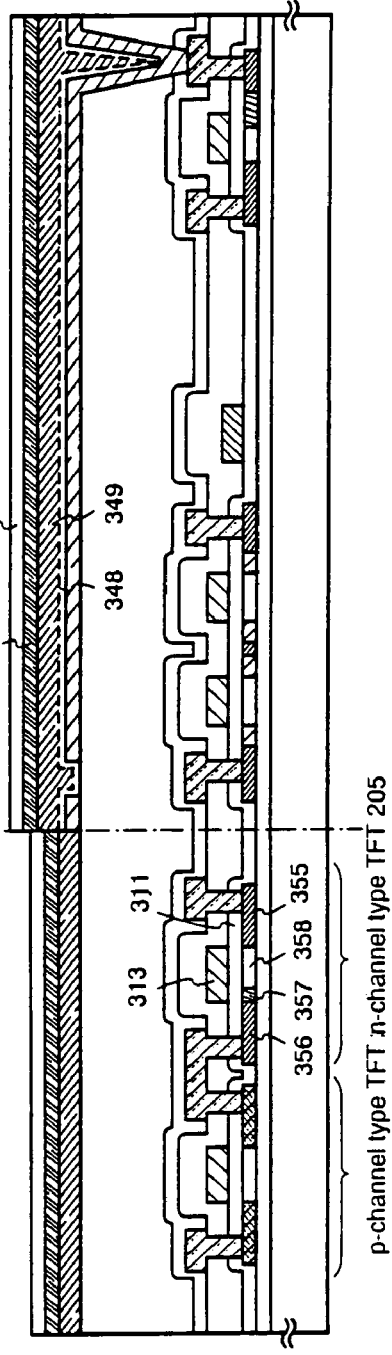

Then, the alkaline compound 348 is formed, as shown in FIG. 6C. In the present embodiment, a lithium fluoride film is formed by a vapor deposition method so as to have a film thickness of 5 nm. Thereafter, the EL layer 349 having a thickness of 100 nm is formed by spin coating.

In the present embodiment, as the polymer type organic material for providing light of white color, the materials disclosed in Japanese Laid-Open Patent Publication No. Hei 8-96959 or No. Hei 9-63770 can be used. For example, the material obtained by solving PVK (polyvinyl carbazole), Bu-PBD (2-(4'-tert-butylphenyl)-5-(4"-biphenyl)-1,3,4-oxydiazole), coumarin 6, DCM 1 (4-dicyanomethylene-2-methyl-6-p-dimethyl aminostilyl-4H-pyran), TPB (tetra phenyl butadiene), and Nile Red into 1,2-dichloromethane can be used.

In the present embodiment, the EL layer 349 has a single layer structure including only the above-mentioned light emitting layer. Alternatively, an electron injection layer, an electron transport layer, a hole transport layer, a hole injection layer, an electron blocking layer, or a hole element layer can be further formed, if necessary.

Then, the anode 350 made of a transparent conductive film having a thickness of 200 nm is formed to cover the EL layer 349. In this embodiment, a film made of a compound of indium oxide and zinc oxide is formed by a vapor deposition and then patterned to obtain the anode.

Finally, the second passivation film 351 made of a silicon nitride film is formed by a plasma CVD to have a thickness of 100 nm. This second passivation film 351 is intended to provide protection for the EL layer 349 against water or the like, and also function to release heat generated in the EL layer 349. In order to further enhance the heat radiation effect, it is advantageous to form the second passivation film by forming a silicon nitride film and a carbon film (preferably a diamond-like carbon film) into the lamination structure.

In this way, an active matrix EL display device having a structure as shown in FIG. 6C is completed. In the active matrix EL display device of this embodiment, a TFT having an optimum structure is disposed in not only the pixel portion but also the driving circuit portion, so that very high reliability is obtained and operation characteristics can also be improved.

First, a TFT having a structure to decrease hot carrier injection so as not to drop the operation speed thereof as much as possible is used as an n-channel type TFT 205 of a CMOS circuit forming a driving circuit. Note that the driving circuit here includes a shift register, a buffer, a level shifter, a sampling circuit (sample and hold circuit) and the like. In the case where digital driving is made, a signal conversion circuit such as a D/A converter can also be included.

In the case of this embodiment, as shown in FIG. 6C, the active layer of the n-channel TFT 205 includes a source region 355, a drain region 356, an LDD region 357 and a channel forming region 358, and the LDD region 357 overlaps with the gate electrode 313 through the gate insulating film 311.

Consideration not to drop the operation speed is the reason why the LDD region is formed at only the drain region side. In this n-channel type TFT 205, it is not necessary to pay attention to an off current value very much, rather, it is better to give importance to an operation speed. Thus, it is desirable that the LDD region 357 is made to completely overlap with the gate electrode to decrease a resistance component to a minimum. That is, it is preferable to remove the so-called offset.

Furthermore, deterioration of the p-channel type TFT 206 in the CMOS circuit due to the injection of hot carriers is almost negligible, and thus, it is not necessary to provide any LDD region for the p-channel type TFT 206. It is of course possible to provide the LDD region for the p-channel type TFT 206, similarly for the n-channel type TFT 205, to exhibit countermeasure against the hot carriers.

Note that, among the driving circuits, the sampling circuit is somewhat unique compared to the other circuits, in that a large electric current flows in both directions in the channel forming region. Namely, the roles of the source region and the drain region are interchanged. In addition, it is necessary to control the value of the off current to be as small as possible, and with that in mind, it is preferable to use a TFT having functions which are on an intermediate level between the switching TFT and the current control TFT in the sampling circuit. A combination of an n-channel type TFT 207 and a p-channel type TFT 208 as shown in FIG. 10 is used as the sampling circuit in embodiment 1.

Figure 10:
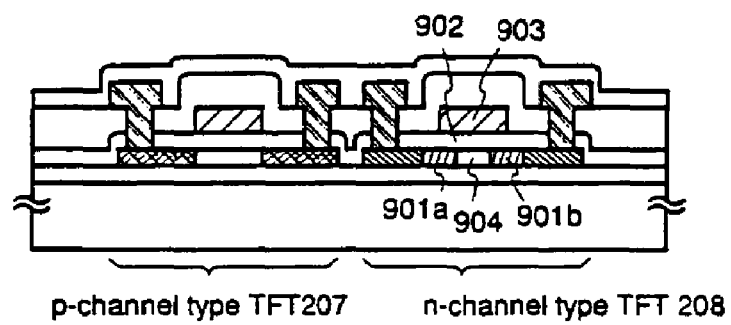
FIG. 10 is a view of the structure of a sampling circuit of an EL display device.

Accordingly, in the n-channel type TFT for forming the sampling circuit, it is desirable to arrange the TFTs having the structure as shown in FIG. 10. As illustrated in FIG. 10, portions of the LDD regions 901a and 901b overlap the gate electrode 903 through the gate insulating film 902. The advantages obtainable by this structure have been already described with respect to the current control TFT 202. In the case where the TFT is used for the sampling circuit, the LDD regions are disposed to interpose the channel forming region 904 therebetween, which is different from the case of the current control TFT.

Figure 1:
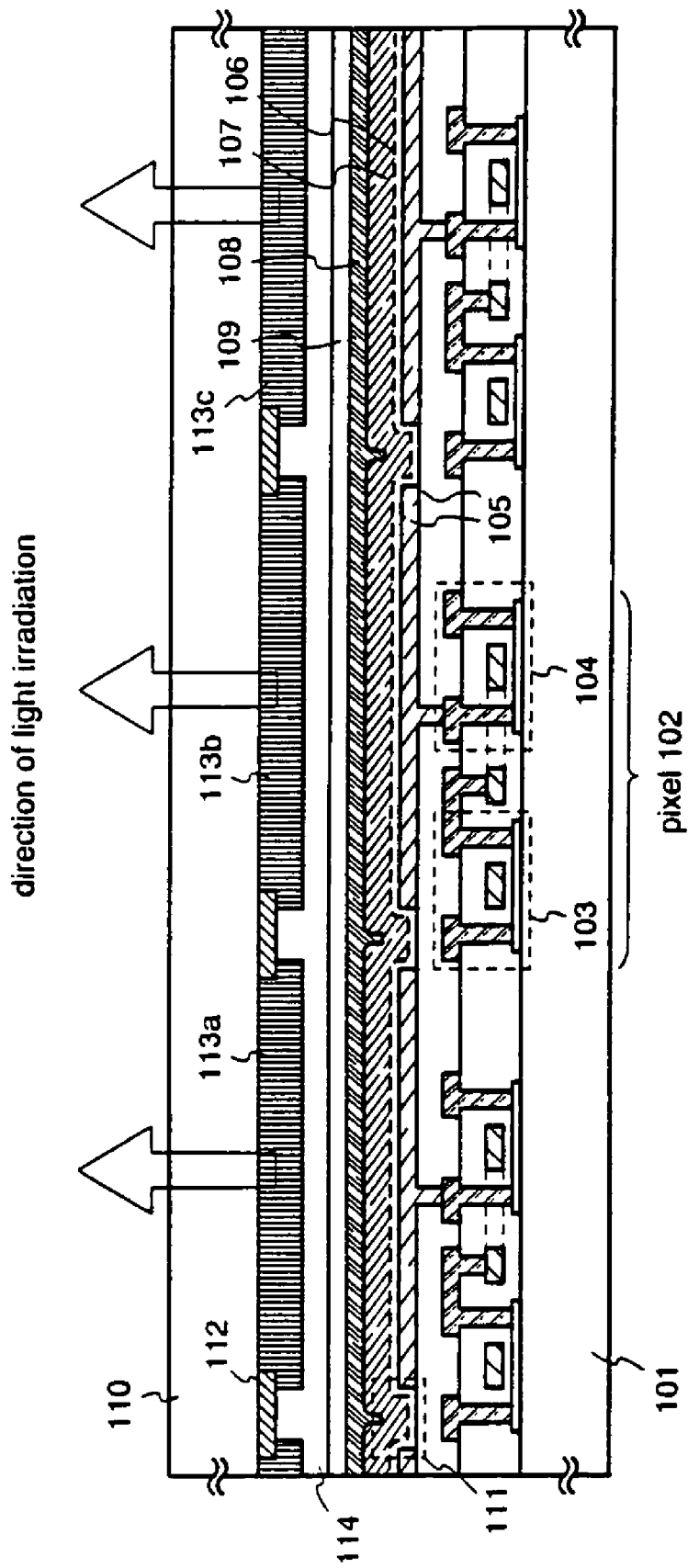
FIG. 1 is a view for illustrating a pixel portion of an EL display device.

In the actual process, after the structure shown in FIG. 6C is completed, the EL layer is sealed in the closed space by using the counter substrate provided with the light shielding film, as previously described with reference to FIGS. 1 and 2. At this time, the reliability (lifetime) of the EL layer can be improved by setting an inert atmosphere within the closed space or disposing a moisture absorbing material (e.g., barium oxide) in the closed space. Such a sealing process of the EL layer can be performed by using the technique to be used in the cell assembly step for liquid crystal display devices.

After the sealing process of the EL layer is completed, a connector (flexible print circuit: FPC) is attached for connecting the terminals extended from the elements or circuits formed on the substrate to external signal terminals, thereby completing a final product.

Here, the structure of the active matrix EL display device of this embodiment will be described with reference to a perspective view of FIG. 7. The active matrix EL display device of this embodiment is constituted by a pixel portion 602, a gate side driving circuit 603, and a source side driving circuit 604 formed on a glass substrate 601. A switching TFT 605 of a pixel portion is an n-channel type TFT, and is disposed at an intersection point of a gate wiring line 606 connected to the gate side driving circuit 603 and a source wiring line 607 connected to the source side driving circuit 604. The drain of the switching TFT 605 is connected to the gate of a current control TFT 608.

Furthermore, the source side of the current control TFT 608 is connected to the power supply line 609. In the structure in accordance with the present embodiment, the power supply line 609 is connected to the source of the EL element 610, and the drain of the current control TFT 608 is connected to the EL element 610.

If the current control TFT 608 is an n-channel type TFT, then a cathode of the EL element 610 is electrically connected to the drain. Further, in a case of using a p-channel type TFT for the current control TFT 608, an anode of the EL element 610 is electrically connected to the drain.

Input/output wiring lines (connection wiring lines) 612 and 613 for transmitting signals to the driving circuits and a connection wiring line 614 connected to the current supply line 609 are provided in an FPC 611 as an external input/output terminal.

Figure 7:
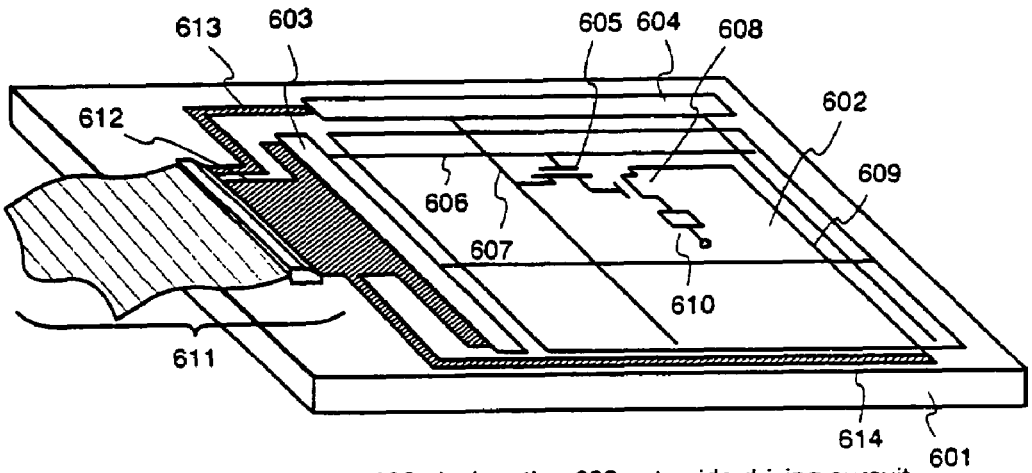
FIG. 7 is a view for illustrating the perspective appearance of an EL display device.
Figure 8:
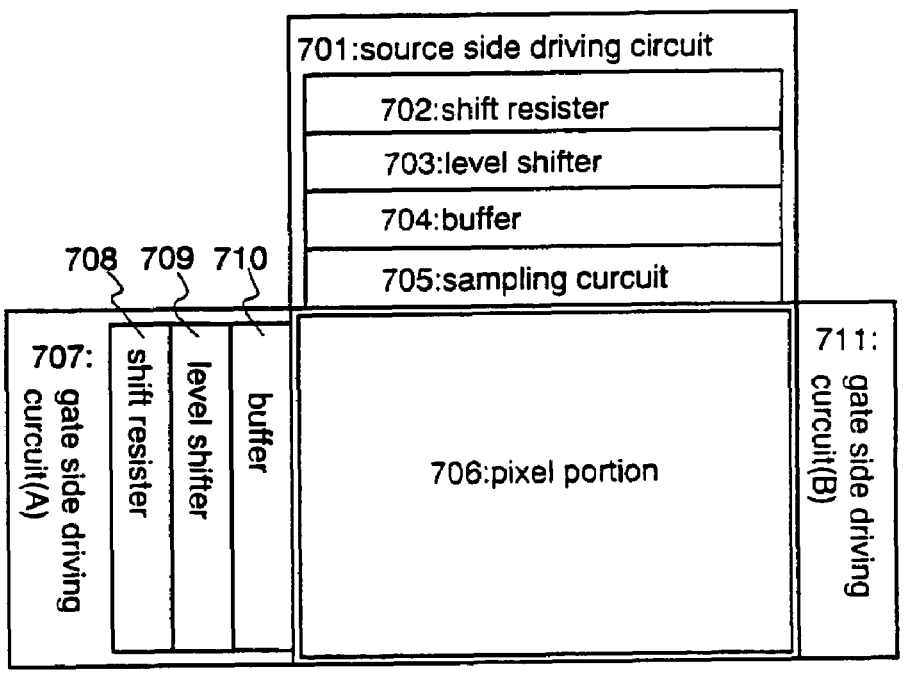
FIG. 8 is a view for illustrating the circuit block configuration of an EL display device.

An example of circuit structure of the EL display device shown in FIG. 7 is shown in FIG. 8. The EL display device of this embodiment includes a source side driving circuit 701, a gate side driving circuit (A) 707, a gate side driving circuit (B) 711, and a pixel portion 706. Note that in the present specification, the term driving circuit is a general term including the source side driving circuit and the gate side driving circuit.

The source side driving circuit 701 is provided with a shift register 702, a level shifter 703, a buffer 704, and a sampling circuit (sample and hold circuit) 705. The gate side driving circuit (A) 707 is provided with a shift register 708, a level shifter 709, and a buffer 710. The gate side driving circuit (B) 711 also has the same structure.

Here, the shift registers 702 and 708 have driving voltages of 5 to 16 V (typically 10 V) respectively, and the structure indicated by 205 in FIG. 6C is suitable for an n-channel type TFT used in a CMOS circuit forming the circuit.

Besides, for each of the level shifters 703 and 709 and the buffers 704 and 710, similarly to the shift register, the CMOS circuit including the n-channel type TFT 205 of FIG. 6C is suitable. Note that it is effective to make a gate wiring line a multi-gate structure such as a double gate structure or a triple gate structure in improving reliability of each circuit.

Besides, since the source region and the drain region are inverted and it is necessary to decrease an off current value, a CMOS circuit including the n-channel type TFT 208 of FIG. 10 is suitable for the sampling circuit 705.

The pixel portion 706 is disposed with pixels having the structure shown in FIG. 2.

The foregoing structure can be easily realized by manufacturing TFTs in accordance with the manufacturing steps shown in FIGS. 4A to 6C. In this embodiment, although only the structure of the pixel portion and the driving circuit is shown, if the manufacturing steps of this embodiment are used, it is possible to form a logical circuit other than the driving circuit, such as a signal dividing circuit, a D/A converter circuit, an operational amplifier circuit, a $\bar{a}$-correction circuit, or the like on the same substrate, and further, it is considered that a memory portion, a microprocessor, or the like can be formed.

Figure 11A:
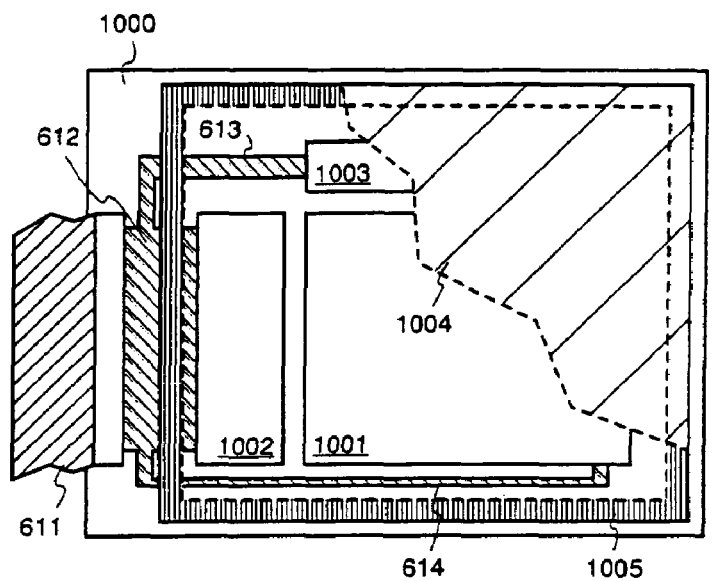
FIG. 11A is a top view for illustrating the appearance of an EL display device.

Furthermore, the EL display device in accordance with the present embodiment will be described with reference to FIGS. 11A and 11B. The reference signs used in FIGS. 7 and 8 are referred if necessary.

A substrate 1000 (including an base film beneath TFTs) is an active matrix substrate. On the substrate, a pixel portion 1001, a source side driving circuit 1002, and a gate side driving circuit 1003 are formed. Various wirings from the respective driving circuits are extended through connection wirings 612 to 614 to reach an FPC 611 and be connected to an external device.

At this time, a counter substrate 1004 is provided to surround at least the pixel portion, and more preferably, the driving circuits and the pixel portion. The counter substrate 1004 is adhered to the active matrix substrate 1000 by means of an adhesive (sealing agent) 1005 to form a closed space 1006. Thus, the EL element is completely sealed in the closed space 1006 and shut out from the external air.

In the present embodiment, a photocurable epoxy resin is used as the adhesive 1005. Alternatively, other adhesives such as an acrylate type resin can also be used. A thermosetting resin can be also used if acceptable in view of heat-resistance of the EL element. Note that the material is required to prevent oxygen and water from passing therethrough as much as possible. The adhesive 1005 can be applied by a coating device such as a dispenser.

Furthermore, in the present embodiment, the closed space 1006 between the counter substrate 1004 and the active matrix substrate 1000 is filed with nitrogen gas. Moreover, the counter substrate 1004 is provided on its inner side (on the side closer to the closed space) with a light shielding film 1007 and a color filter 1008, as described with reference to FIGS. 1 and 2. In the present embodiment, a resin film containing barium oxide and a black-colored pigment is used as the light shielding film 1007, and a resin film containing a red-colored, green-colored, or blue-colored pigment can be used as the color filter 1008.

Figure 11B:
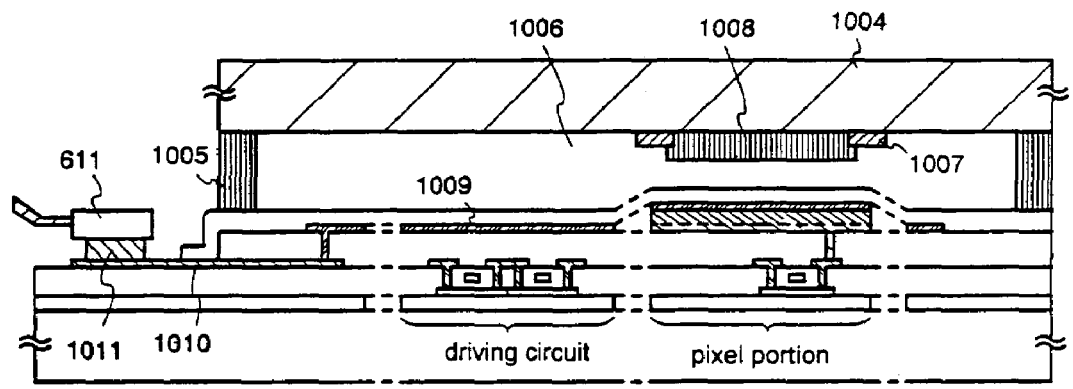
FIG. 11B is a cross-sectional view for illustrating the appearance of an EL display device.

Furthermore, as shown in FIG. 11B, the pixel portion is provided with a plurality of pixels each including an individually separated EL element. All of these EL elements share an anode 1009 as a common electrode. The EL layer may be provided only in the pixel portion, but is not required to be disposed over the driving circuits. In order to selectively provide the EL layer, a vapor deposition method employing a shadow mask, a lift-off method, a dry etching method, or a laser scribing method can be used.

The anode 1009 is electrically connected to a connection wiring 1010. The connection wiring 1010 is a power supply line to be used for supplying a predetermined voltage to the anode 1009, and is connected to the FPC 611 through a conductive paste material 1011. Although only the connection wiring 1010 is described herein, the other connection wirings 612 to 614 are also electrically connected to the FPC 611 in the similar manner.

As described above, the structure as shown in FIGS. 11A and 11B can display an image on its pixel portion by connecting the FPC 611 to a terminal of an external device. In the present specification, the EL display device is defined as a product in which an image display becomes possible when an FPC is attached thereto, in other words, a product obtained by attaching an active matrix substrate to a counter substrate (including the one provided with an FPC attached thereto.)

Embodiment 2

Figure 12:
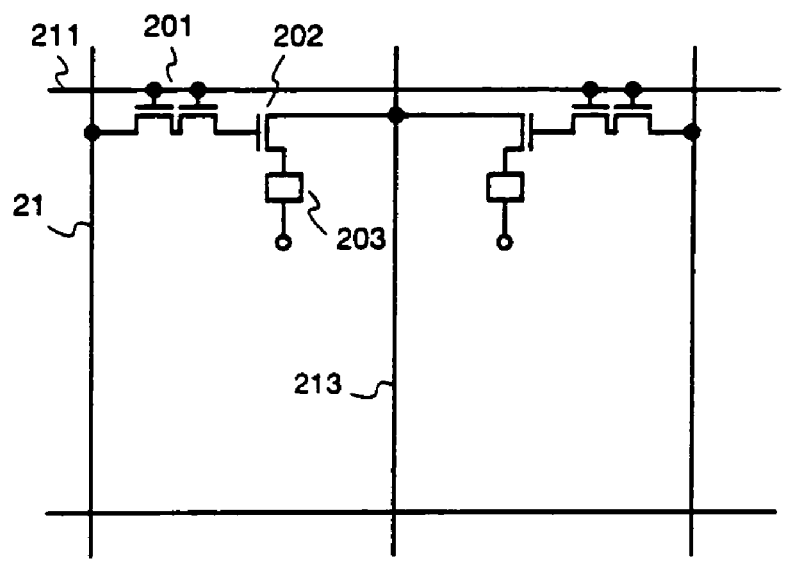
FIG. 12 is a view for illustrating the pixel structure of an EL display device.
Figure 13:
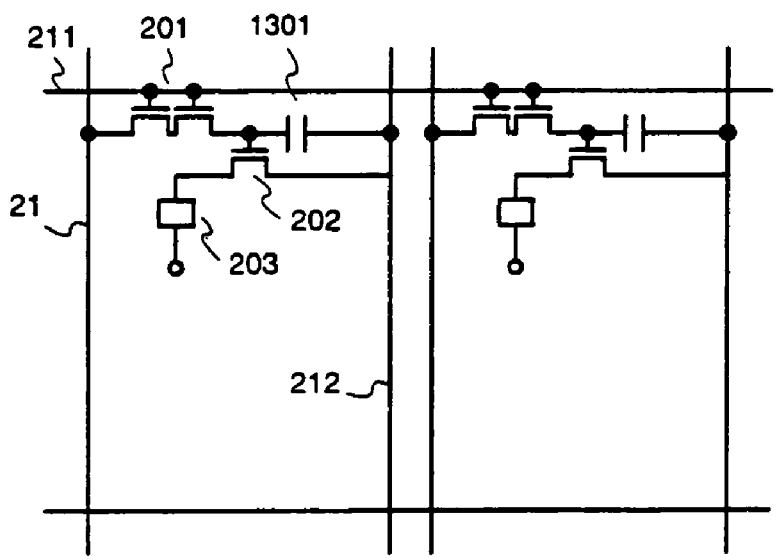
FIG. 13 is a view for illustrating the cross-sectional structure of a pixel of an EL display device.

In this embodiment, an example in which a structure of a pixel is made different from the structure shown in FIG. 3B will be described with reference to FIG. 12. In this embodiment, two pixels shown in FIG. 3B are arranged to become symmetrical with respect to a current supply line 212 which applies ground electric potential. That is, as shown in FIG. 12, a current supply line 213 is made common to two adjacent pixels, so that the number of necessary wiring lines can be reduced. Incidentally, a TFT structure or the like arranged in the pixel may remain the same.

If such structure is adopted, it becomes possible to manufacture a more minute pixel portion, and the quality of an image is improved.

Incidentally, the structure of this embodiment can be easily realized in accordance with the manufacturing steps of the embodiment 1, and with respect to the TFT structure or the like, the description of the embodiment 1 or FIG. 2 may be referred to.

Embodiment 3

Although the description has been made on the case of the top gate type TFT in the embodiments 1 and 2, the present invention is not limited to the TFT structure, and may be applied to a bottom gate type TFT (typically, inverted stagger type TFT). Besides, the inverted stagger type TFT may be formed by any means.

Since the inverted stagger type TFT has such a structure that the number of steps can be easily made smaller than the top gate type TFT, it is very advantageous in reducing the manufacturing cost, which is the object of the present invention. Incidentally, the structure of this embodiment can be freely combined with any structure of the embodiments 2 and 3.

Embodiment 4

FIG. 3B shows that the amount of the off current value in the switching TFT in the pixel of the EL display device is reduced by using a multi-gate structure for the switching TFT, and the need for a storage capacitor is eliminated. However, it is also acceptable to make a structure of disposing a storage capacitor as is done conventionally. In this case, as shown in FIG. 14, a storage capacitor 1301 is formed in parallel to the gate of the current control TFT 202 with respect to the drain of the switching TFT 201.

Note that the constitution of embodiment 4 can be freely combined with any constitution of embodiments 1 to 3. Namely, a storage capacitor is merely formed within a pixel and it is not to limit the TFT structure, materials of EL layer, etc.

Embodiment 5

Laser crystallization is used as the means of forming the crystalline silicon film 302 in embodiment 1, and a case of using a different means of crystallization is explained in embodiment 5.

After forming an amorphous silicon film in embodiment 5, crystallization is performed using the technique recorded in Japanese Patent Application Laid-open No. Hei 7-130652. The technique recorded in the above patent application is one of obtaining a crystalline silicon film having good crystallinity by using an element such as nickel as a catalyst for promoting crystallization.

Further, after the crystallization process is completed, a process of removing the catalyst used in the crystallization may be performed. In this case, the catalyst may be gettered using the technique recorded in Japanese Patent Application Laid-open No. Hei 10-270363 or Japanese Patent Application Laid-open No. Hei 8-330602.

In addition, a TFT may be formed using the technique recorded in the specification of Japanese Patent Application No. Hei 11-076967 by the applicant of the present invention. The processes of manufacturing shown in embodiment 1 are one embodiment of the present invention, and provided that the structure of FIG. 1 or of FIG. 6C of embodiment 1 can be realized, then other manufacturing process may also be used without any problems, as above.

Note that it is possible to freely combine the constitution of embodiment 5 with the constitution of any of embodiments 1 to 4.

Embodiment 6

In driving the EL display device of the present invention, analog driving can be performed using an analog signal as an image signal, and digital driving can be performed using a digital signal.

When analog driving is performed, the analog signal is sent to a source wiring of a switching TFT, and the analog signal, which contains gray scale information, becomes the gate voltage of a current control TFT. The current flowing in an EL element is then controlled by the current control TFT, the EL element emitting intensity is controlled, and gray scale display is performed.

On the other hand, when digital driving is performed, it differs from the analog type gray scale display, and gray scale display is performed by time division driving.

The EL element has an extremely fast response speed in comparison to a liquid crystal element, and therefore it is possible to have high speed driving. Therefore, the EL element is one, which is suitable for time ratio gray scale driving, in which one frame is partitioned into a plural number of subframes and then gray scale display is performed.

The present invention is a technique related to the element structure, and therefore any method of driving it may thus be used.

Embodiment 7

The EL display device uses light emitted from itself, and thus, does not require any back light. A reflection type liquid crystal display device requires a back light in a dark place where sufficient light is not available, although it has a feature in that an image can be displayed with outdoor light. On the other hand, the EL display device is not suffered from such a disadvantage in a dark place, since it is of the self-emission type.

However, when an electronic device including the EL display device as its display portion is actually used outdoors, it may be of course used both in a light place and in a dark place. In such a situation, an image can be sufficiently recognized in a dark place even when the luminance is not so high, while an image may not be recognized in a light place if the luminance is not sufficiently high.

An amount of light emitted from the EL layer varies depending on an amount of current to flow. Thus, a larger amount of current to flow requires the higher luminance, resulting in an increased power consumption. However, when the luminance of emitted light is set at such a high level, too brighter image than necessary with too large power consumption will be displayed in a dark place.

In order to overcome the above-mentioned disadvantage, the EL display device in accordance with the present invention preferably has a function to detect the lightness in the surrounding atmosphere by means of a sensor, and adjust the luminance of the light emitted from the EL layer in accordance with the sensed lightness. More specifically, the luminance of the emitted light is set at a high level in a light place, while at a low level in a dark place, so that an increase in power consumption is avoided. Thus, the EL display device in accordance with the present invention can realize reduction in power consumption.

As a sensor to be used for detecting lightness in the surrounding atmosphere, a CMOS sensor, a CCD or the like can be used. A CMOS sensor can be formed with any known technique on the identical substrate with driving circuits and a pixel portion of the EL display device. A semiconductor chip on which a CCD is formed can be attached onto the EL display device. Alternatively, a CCD or a CMOS sensor may be provided as a portion of an electronic device including the EL display device as its display portion.

A circuit for adjusting a current to flow into the EL layer based on a signal obtained by the sensor for detecting the lightness in the surrounding atmosphere is provided. Thus, the luminance of the light emitted from the EL layer can be adjusted in accordance with the lightness in the surrounding atmosphere.

The structure in the present embodiment is applicable in combination with any structure in Embodiment 1 through 6.

Although the preferred embodiments of the present invention utilize thin film transistors as switching elements formed over an insulating substrate, it is possible to utilize a silicon substrate. In this case, insulated gate field effect transistors formed with the silicon substrate can be used as switching elements.

Embodiment 8

The EL display device fabricated in accordance with the present invention is of the self-emission type, and thus exhibits more excellent recognizability of the displayed image in a light place as compared to the liquid crystal display device. Furthermore, the EL display device has a wider viewing angle. Accordingly, the EL display device can be applied to a display portion in various electronic devices. For example, in order to view a TV program or the like on a large-sized screen, the EL display device in accordance with the present invention can be used as a display portion of an EL display (i.e., a display in which an EL display device is installed into a frame) having a diagonal size of 30 inches or larger (typically 40 inches or larger.)

The EL display includes all kinds of displays to be used for displaying information, such as a display for a personal computer, a display for receiving a TV broadcasting program, a display for advertisement display. Moreover, the EL display device in accordance with the present invention can be used as a display portion of other various electric devices.

Such electronic devices include a video camera, a digital camera, a goggles-type display (head mount display), a car navigation system, a car audio equipment, note-size personal computer, a game machine, a portable information terminal (a mobile computer, a portable telephone, a portable game machine, an electronic book, or the like), an image reproduction apparatus including a recording medium (more specifically, an apparatus which can reproduce a recording medium such as a compact disc (CD), a laser disc (LD), a digital video disc (DVD), and includes a display for displaying the reproduced image), or the like. In particular, in the case of the portable information terminal, use of the EL display device is preferable, since the portable information terminal that is likely to be viewed from a tilted direction is often required to have a wide viewing angle. FIGS. 14A to 14F respectively show various specific examples of such electronic devices.

Figure 14A:
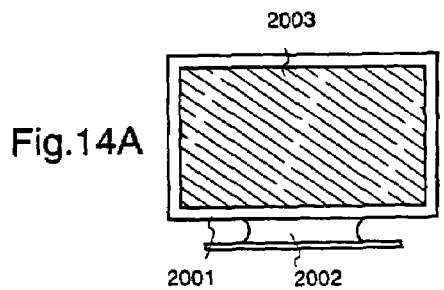
FIGS. 14A to 14F are views for respectively illustrating specific examples of an electronic device.

FIG. 14A illustrates an EL display which includes a frame 2001, a support table 2002, a display portion 2003, or the like. The present invention is applicable to the display portion 2003. The EL display is of the self-emission type and therefore requires no back light. Thus, the display portion thereof can have a thickness thinner than that of the liquid crystal display device.

Figure 14B:
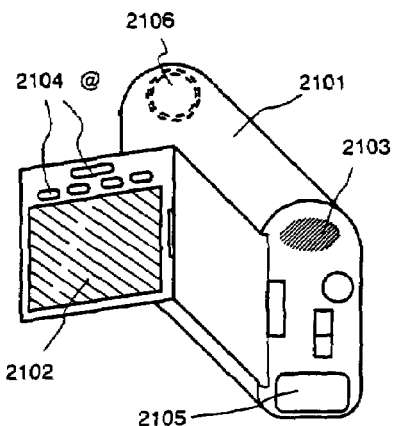

FIG. 14B illustrates a video camera which includes a main body 2101, a display portion 2102, an audio input portion 2103, operation switches 2104, a battery 2105, an image receiving portion 2106, or the like. The EL display device in accordance with the present invention can be used as the display portion 2102.

Figure 14C:
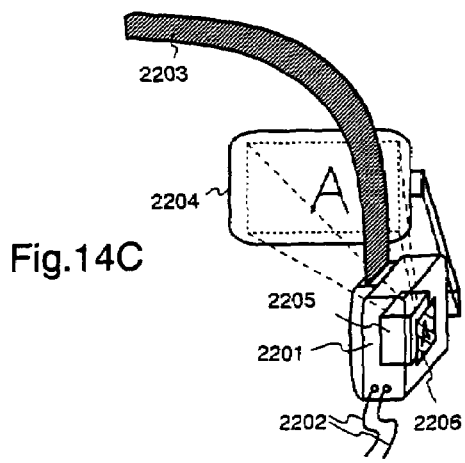

FIG. 14C illustrates a portion (the right-half piece) of an EL display of head mount type, which includes a main body 2201, signal cables 2202, a head mount band 2203, a display portion 2204, an optical system 2205, an EL display device 2206, or the like. The present invention is applicable to the EL display device 2206.

Figure 14D:
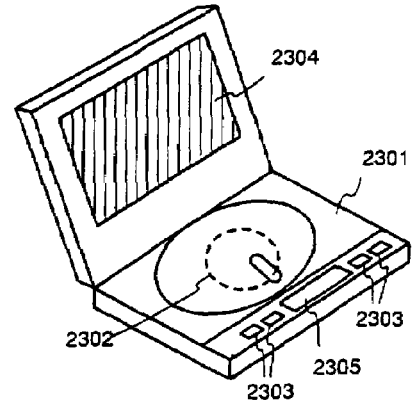

FIG. 14D illustrates an image reproduction apparatus including a recording medium (more specifically, a DVD reproduction apparatus), which includes a main body 2301, a recording medium (a CD, an LD, a DVD or the like) 2302, operation switches 2303, a display portion (a) 2304, another display portion (b) 2305, or the like. The display portion (a) is used mainly for displaying image information, while the display portion (b) is used mainly for displaying character information. The EL display device in accordance with the present invention can be used as these display portions (a) and (b). The image reproduction apparatus including a recording medium further includes a CD reproduction apparatus, a game machine or the like.

Figure 14E:
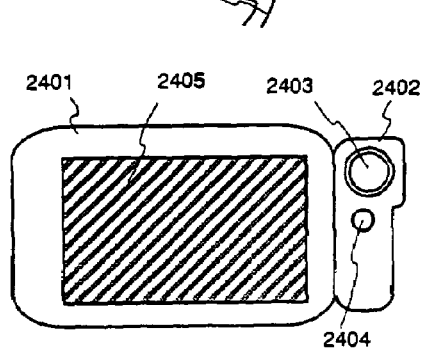

FIG. 14E illustrates a portable (mobile) computer which includes a main body 2401, a camera portion 2402, an image receiving portion 2403, operation switches 2404, a display portion 2405, or the like. The EL display device in accordance with the present invention can be used as the display portion 2405.

Figure 14F:
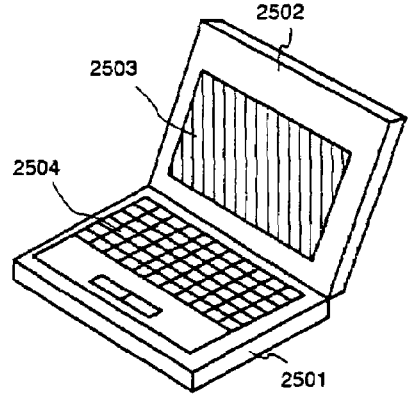

FIG. 14F illustrates a personal computer which includes a main body 2501, a frame 2502, a display portion 2503, a key board 2504, or the like. The EL display device in accordance with the present invention can be used as the display portion 2503.

When the brighter luminance of light emitted from the EL material becomes available in the future, the EL display device in accordance with the present invention will be applicable to a front-type or rear-type projector in which light including output image information is enlarged by means of lenses or the like to be projected.

The aforementioned electronic devices are more likely to be used for display information distributed through a telecommunication path such as Internet, a CATV (cable television system), and in particular likely to display moving picture information. The EL display device is suitable for displaying moving pictures since the EL material can exhibit high response speed. However, if the contour between the pixels becomes unclear, the moving pictures as a whole cannot be clearly displayed. Since the EL display device in accordance with the present invention can make the contour between the pixels clear, it is significantly advantageous to apply the EL display device of the present invention to a display portion of the electronic devices.

A portion of the EL display device that is emitting light consumes power, so it is desirable to display information in such a manner that the light emitting portion therein becomes as small as possible. Accordingly, when the EL display device is applied to a display portion which mainly displays character information, e.g., a display portion of a portable information terminal, and more particular, a portable telephone or a car audio equipment, it is desirable to drive the EL display device so that the character information is formed by a light-emitting portion while a non-emission portion corresponds to the background.

Figure 15A:
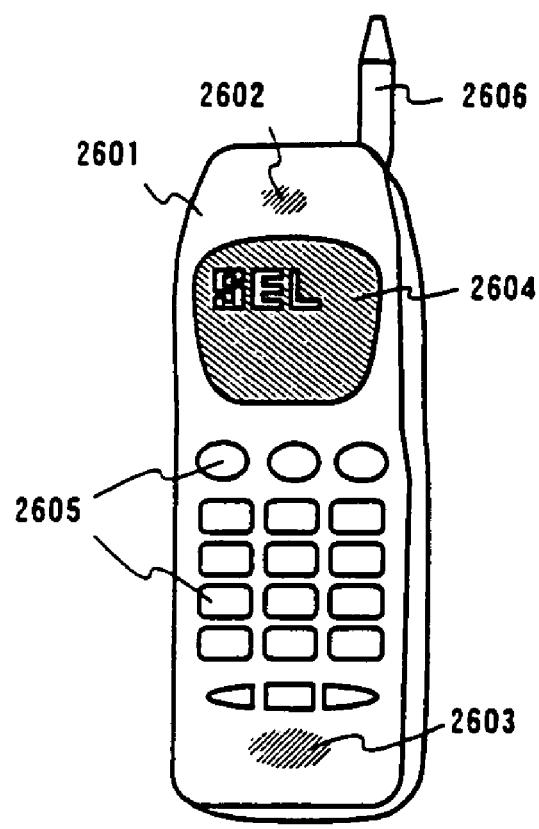
FIGS. 15A and 15B are views for respectively illustrating specific examples of an electronic device.

With now reference to FIG. 15A, a portable telephone is illustrated, which includes a main body 2601, an audio output portion 2602, an audio input portion 2603, a display portion 2604, operation switches 2605, and an antenna 2606. The EL display device in accordance with the present invention can be used as the display portion 2604. The display portion 2604 can reduce power consumption of the portable telephone by displaying white-colored characters on a black-colored background.

Figure 15B:
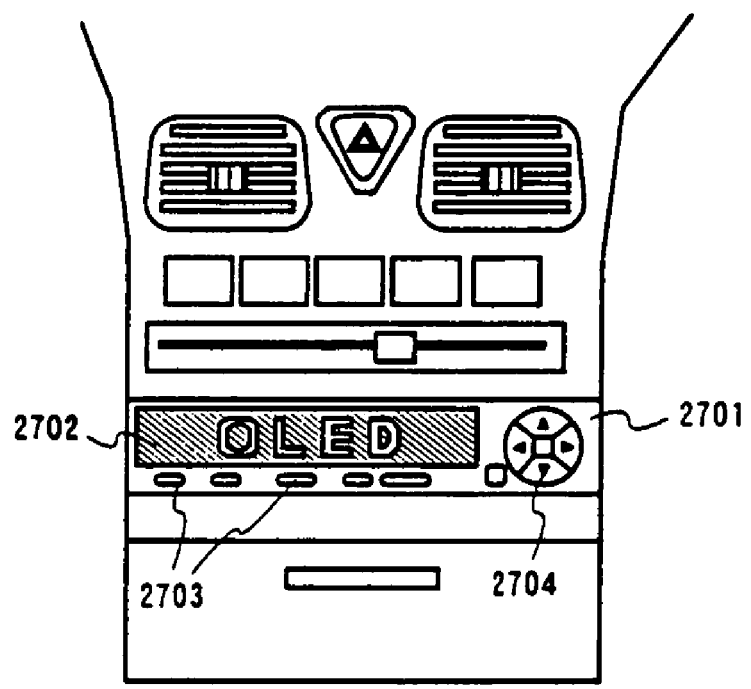
Figure 16A:
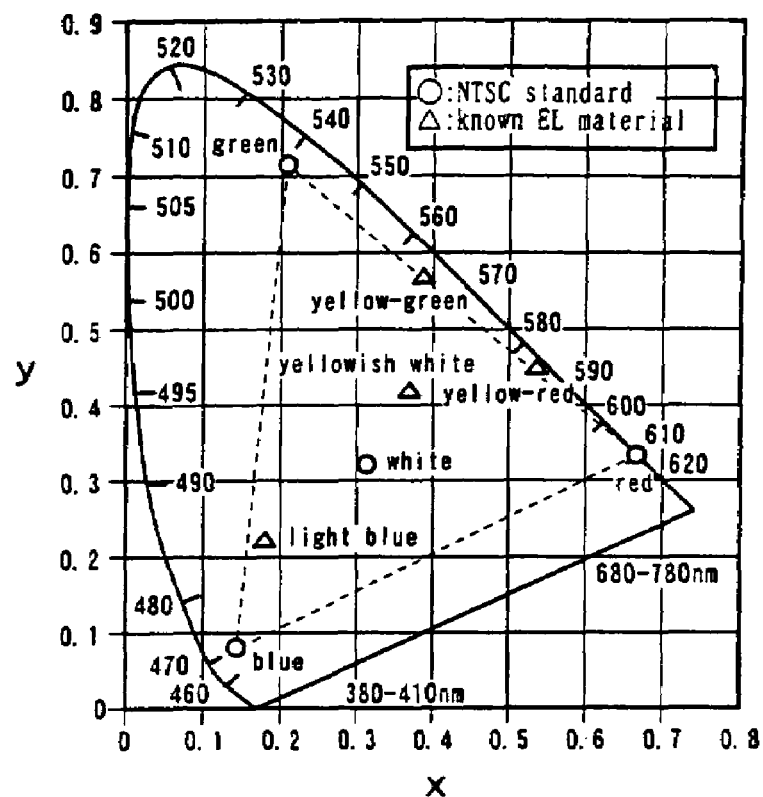
FIGS. 16A and 16B are diagrams for respectively showing the chromaticity coordinates of organic materials.
Figure 16B:
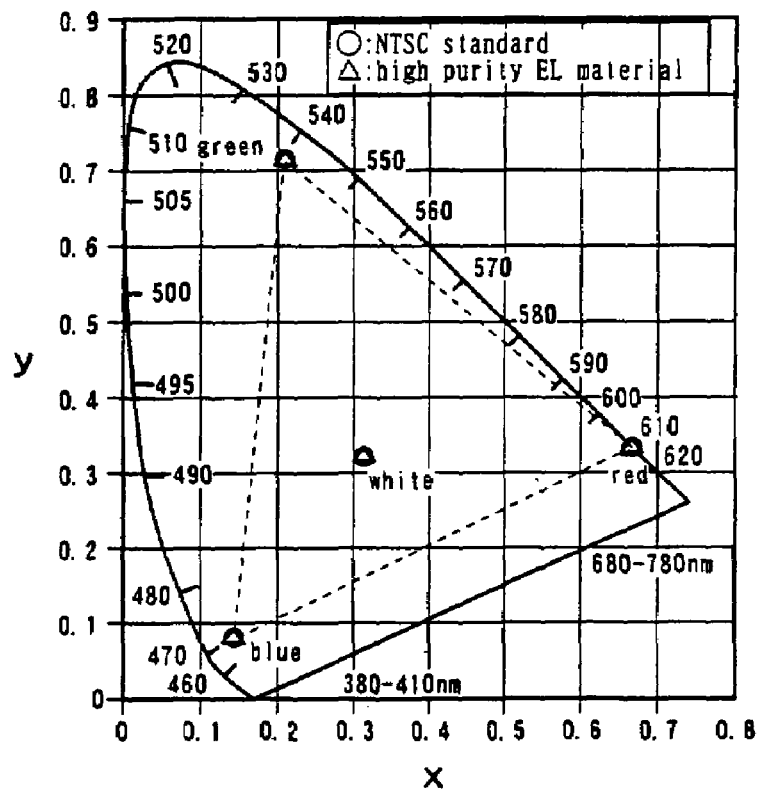

FIG. 15B illustrates a car audio equipment which includes a main body 2701, a display portion 2702, and operation switches 2703 and 2704. The EL display device in accordance with the present invention can be used as the display portion 2702. Although the car audio equipment of the mount type is shown in the present embodiment, the present invention is also applicable to a car audio of the set type. The display portion 2702 can reduce power consumption by displaying white-colored characters on a black-colored background, which is particularly advantageous for the car audio of the set type.

As set forth above, the present invention can be applied variously to a wide range of electronic devices in all fields. The electronic device in the present embodiment can be obtained by utilizing an EL display device having the configuration in which the structures in Embodiments 1 through 7 are freely combined.

In accordance with the present invention, in the pixel portion of the EL display device, the contour between the pixels can be made clear, and the EL display device capable of displaying an image with high definition can be provided. Moreover, in the present invention the light shielding film to be used for concealing the gaps between the pixels is provided on the counter substrate, thereby preventing yield from decreasing. Furthermore, the EL display device in accordance with the present invention can be fabricated by using a manufacturing line for liquid crystal display devices, and thus, equipment investment can be suppressed to a small level. Accordingly, in accordance with the present invention, an inexpensive EL display device capable of displaying an image with high definition can be obtained. Furthermore, the present invention can also provide an electronic device having a display portion with a high recognizability by utilizing such an EL display device as the display portion.

What is claimed is:

1. An EL display device, comprising:
an active matrix substrate on which a first pixel, a second pixel and a third pixel are arranged, each of the first pixel, the second pixel and the third pixel including a TFT and an EL element;
a passivation film over the EL element;
transparent adhesive over the passivation film;
a counter substrate over the transparent adhesive;
wherein the counter substrate is provided with:
a light shielding film disposed in an area covering at least one of a space between the first pixel and the second pixel and a space between the second pixel and the third pixel; and
a first color filter for obtaining red light over the first pixel;
a second color filter for obtaining green light over the second pixel; and
a third color filter for obtaining blue light over the third pixel.

2. The EL display device according to claim 1, wherein the first color filter, the second color filter and the third color filter include a resin containing a drying agent.

3. The EL display device according to claim 2, wherein the passivation film is in contact with the transparent adhesive.

4. The EL display device according to claim 1, wherein the light shielding film includes a resin containing a drying agent.

5. The EL display device according to claim 1, wherein the EL element includes a light emitting layer including a polymer type organic material.

6. The EL display device according to claim 1, wherein the EL display device using for a display portion of an electronic device selected from a group consisting of a video camera, a head mount type display, a DVD, a portable computer, a personal computer, a portable telephone and a car audio equipment.

7. The EL display device according to claim 1, wherein the passivation film comprises silicon nitride.

8. The EL display device according to claim 1, wherein the passivation film comprises silicon oxynitride.

9. The EL display device according to claim 1, wherein the passivation film is in contact with the EL element.

10. The EL display device according to claim 1, wherein the transparent adhesive is in contact with the first color filter, the second color filter, the third color filter, and the light shielding film.

11. The EL display device according to claim 1, wherein the light shielding film includes a resin.

12. The EL display device according to claim 1, wherein the TFT is a bottom gate type TFT.

13. The EL display device according to claim 1, wherein the TFT includes a crystalline semiconductor film.

14. The EL display device according to claim 1, wherein the TFT includes an amorphous semiconductor film.

15. An EL display device, comprising:
a glass substrate;
a first pixel provided over the glass substrate, a second pixel provided over the glass substrate and adjacent to the first pixel, and a third pixel provided over the glass substrate and adjacent to the second pixel wherein the second pixel is located between the first pixel and the third pixel, each of the first pixel, the second pixel and the third pixel including a TFT and an EL element wherein the EL element includes an organic light emitting material;
a passivation film formed on the EL elements of the first pixel, the second pixel and the third pixel, the passivation film including at least one insulating film;
a counter substrate opposed to the glass substrate with a transparent adhesive interposed therebetween wherein the transparent adhesive is in contact with the passivation film;
wherein the counter substrate is provided with:
a light shielding film disposed in an area covering at least a space between the first pixel and the second pixel and a space between the second pixel and the third pixel; and
a first color filter for obtaining red light over the first pixel;
a second color filter for obtaining green light over the second pixel; and
a third color filter for obtaining blue light over the third pixel.

16. The EL display according to claim 15, wherein the EL element includes a light emitting layer including a polymer type organic material.

17. The EL display device according to claim 15, wherein the EL display device using for a display portion of an electronic device selected from a group consisting of a video camera, a head mount type display, a DVD, a portable computer, a personal computer, a portable telephone and a car audio equipment.

18. The EL display device according to claim 15, wherein the passivation film comprises silicon nitride.

19. The EL display device according to claim 15, wherein the passivation film comprises silicon oxynitride.

20. The EL display device according to claim 15, wherein the transparent adhesive is in contact with the first color filter, the second color filter, the third color filter, and the light shielding film.

21. The EL display device according to claim 15, wherein the light shielding film includes a resin.

22. The EL display device according to claim 15, wherein the TFT is a bottom gate type TFT.

23. The EL display device according to claim 15, wherein the TFT includes a crystalline semiconductor film.

24. The EL display device according to claim 15, wherein the TFT includes an amorphous semiconductor film.

25. An EL display device, comprising:
a glass substrate;
a first pixel provided over the glass substrate, a second pixel provided over the glass substrate and adjacent to the first pixel, and a third pixel provided over the glass substrate and adjacent to the second pixel wherein the second pixel is located between the first pixel and the third pixel, each of the first pixel, the second pixel and the third pixel including a TFT and an EL element wherein the EL element includes an organic light emitting material;
a passivation film formed on the EL elements of the first pixel, the second pixel and the third pixel, the passivation film including at least one insulating film;
a counter substrate opposed to the glass substrate with a transparent adhesive interposed therebetween wherein the transparent adhesive is in contact with the passivation film;
wherein the counter substrate is provided with:
a light shielding film disposed in an area covering at least a space between the first pixel and the second pixel and a space between the second pixel and the third pixel; and
a first color filter for obtaining red light over the first pixel;
a second color filter for obtaining green light over the second pixel; and
a third color filter for obtaining blue light over the third pixel,
wherein the first color filter covers a first edge portion of the light shielding film, and wherein the second color filter covers a second edge portion of the light shielding film.

26. The EL display device according to claim 25, wherein the EL element includes a light emitting layer including a polymer type organic material.

27. The EL display device according to claim 25, wherein the EL display device using for a display portion of an electronic device selected from a group consisting of a video camera, a head mount type display, a DVD, a portable computer, a personal computer, a portable telephone and a car audio equipment.

28. The EL display device according to claim 25, wherein the passivation film comprises silicon nitride.

29. The EL display device according to claim 25, wherein the passivation film comprises silicon oxynitride.

30. The EL display device according to claim 25, wherein the transparent adhesive is in contact with the first color filter, the second color filter, the third color filter, and the light shielding film.

31. The EL display device according to claim 25, wherein the light shielding film includes a resin.

32. The EL display device according to claim 25, wherein the TFT is a bottom gate type TFT.

33. The EL display device according to claim 25, wherein the TFT includes a crystalline semiconductor film.

34. The EL display device according to claim 25, wherein the TFT includes an amorphous semiconductor film.

35. An EL display device, comprising:
a glass substrate;
a first pixel provided over the glass substrate, a second pixel provided over the glass substrate and adjacent to the first pixel, and a third pixel provided over the glass substrate and adjacent to the second pixel wherein the second pixel is located between the first pixel and the third pixel, each of the first pixel, the second pixel and the third pixel including:
a first TFT;
a second TFT electrically connected to the first TFT;
an EL element including a first electrode, an organic light emitting layer over the first electrode, and a second electrode over the organic light emitting layer, the EL element formed over the first TFT and the second TFT;
a passivation film on the second electrodes of the first pixel and the second pixel and the third pixel, the passivation film including at least one insulating film;
a counter substrate opposed to the glass substrate with a transparent adhesive interposed therebetween wherein the transparent adhesive is in contact with the passivation film;
wherein the counter substrate is provided with:
a light shielding film disposed in an area covering at least a space between the first pixel and the second pixel and a space between the second pixel and the third pixel; and
a first color filter for obtaining red light over the first pixel;
a second color filter for obtaining green light over the second pixel; and
a third color filter for obtaining blue light over the third pixel.

36. The EL display device according to claim 35, wherein the organic light emitting layer includes a polymer type organic material.

37. The EL display device according to claim 35, wherein the EL display device using for a display portion of an electronic device selected from a group consisting of a video camera, a head mount type display, a DVD, a portable computer, a personal computer, a portable telephone and a car audio equipment.

38. The EL display device according to claim 35, wherein the passivation film comprises silicon nitride.

39. The EL display device according to claim 35, wherein the passivation film comprises silicon oxynitride.

40. The EL display device according to claim 35, wherein the transparent adhesive is in contact with the first color filter, the second color filter, the third color filter, and the light shielding film.

41. The EL display device according to claim 35, wherein the light shielding film includes a resin.

42. The EL display device according to claim 35, wherein the first TFT and the second TFT are bottom gate type TFTs.

43. The EL display device according to claim 35, wherein at least one of the first TFT and the second TFT includes a crystalline semiconductor film.

44. The EL display device according to claim 35, wherein at least one of the first TFT and the second TFT includes an amorphous semiconductor film.

45. The EL display device according to claim 35, wherein the first electrodes of the first pixel, the second pixel and the third pixel includes a conductive film having a function to shield light, respectively.

46. The EL display device according to claim 35, wherein the first TFT and the second TFT are n-channel type TFTs.

* * * * *

UNITED STATES PATENT AND TRADEMARK OFFICE
CERTIFICATE OF CORRECTION

PATENT NO. : 7,518,146 B2 Page 1 of 1
APPLICATION NO. : 11/070121
DATED : April 14, 2009
INVENTOR(S) : Shunpei Yamazaki, Mayumi Mizukami and Toshimitsu Konuma It is certified that error appears in the above-identified patent and that said Letters Patent is hereby corrected as shown below:

In The Specification:

Column 14, Line 24, Change "mm" to -- nm --.

In The Claims:

Column 26, Claim 16, Line 14, after "display" insert -- device --.

Column 28, Claim 45, Line 42, Change "includes" to -- include --.

Signed and Sealed this

Thirty-first Day of August, 2010

David J. Kappos
*Director of the United States Patent and Trademark Office*